US009792308B2

(12) United States Patent
Fallon et al.

(10) Patent No.: US 9,792,308 B2
(45) Date of Patent: Oct. 17, 2017

(54) CONTENT ESTIMATION DATA COMPRESSION

(71) Applicant: Realtime Data LLC, Armonk, NY (US)

(72) Inventors: James J. Fallon, Armonk, NY (US); Paul F. Pickel, Bethpage, NY (US); Stephen J. McErlain, Astoria, NY (US); John Buck, Baldwin, NY (US)

(73) Assignee: Realtime Data, LLC, Bronxville, NY (US)

( * ) Notice: Subject to any disclaimer, the term of this patent is extended or adjusted under 35 U.S.C. 154(b) by 328 days.

(21) Appl. No.: 13/875,884

(22) Filed: May 2, 2013

(65) Prior Publication Data

US 2013/0297575 A1    Nov. 7, 2013

Related U.S. Application Data

(63) Continuation-in-part of application No. 14/936,312, filed on Nov. 9, 2015, which is a continuation of
(Continued)

(51) Int. Cl.
| | | |
|---|---|---|
| G06F 7/00 | (2006.01) | |
| G06F 17/00 | (2006.01) | |
| G06F 17/30 | (2006.01) | |

(52) U.S. Cl.
CPC .............................. *G06F 17/30312* (2013.01)

(58) Field of Classification Search
None
See application file for complete search history.

(56) References Cited

U.S. PATENT DOCUMENTS 5,870,036 A * 2/1999 Franaszek ........... H03M 7/3086
  341/51
8,832,044 B1 * 9/2014 Gipp .................. G06F 21/6227
  707/693

(Continued)

OTHER PUBLICATIONS

Absolute Astronomy, "Hard disk," Absoluteastronomy.com, accessed at http://www.absoluteastronomy.com/topics/Hard_disk on May 23, 2013, 13 pages.
(Continued)

*Primary Examiner* — Hasanul Mobin
(74) *Attorney, Agent, or Firm* — Sterne, Kessler, Goldstein & Fox P.L.L.C.

(57) ABSTRACT

The present disclosure is directed to systems and methods for providing fast and efficient data compression using a combination of content dependent, content estimation, and content independent data compression. In one aspect of the disclosure a method for compressing data comprises the steps of: analyzing a data block of an input data stream to identify a data type of the data block, the input data stream comprising a plurality of disparate data types; performing content dependent data compression on the data block, if the data type of the data block is identified; performing content estimation data compression if the content is estimable; and performing content independent data compression on the data block, if the data type of the data block is not identified or estimable. In another aspect of the present invention LZDR compression is applied to simultaneously perform one method of compression while computing statistics useful in estimating the optimal form of compression to be applied.

7 Claims, 14 Drawing Sheets

Related U.S. Application Data application No. 14/727,309, filed on Jun. 1, 2015, which is a continuation of application No. 14/495,574, filed on Sep. 24, 2014, now Pat. No. 9,054,728, which is a continuation of application No. 14/251,453, filed on Apr. 11, 2014, now Pat. No. 8,933,825, which is a continuation of application No. 14/035,561, filed on Sep. 24, 2013, now Pat. No. 8,717,203, which is a continuation of application No. 13/154,211, filed on Jun. 6, 2011, now Pat. No. 8,643,513, which is a continuation of application No. 12/703,042, filed on Feb. 9, 2010, now Pat. No. 8,502,707, which is a continuation of application No. 11/651,366, filed on Jan. 8, 2007, now abandoned, and a continuation of application No. 11/651,365, filed on Jan. 8, 2007, now Pat. No. 7,714,747, which is a continuation of application No. 10/668,768, filed on Sep. 22, 2003, now Pat. No. 7,161,506, which is a continuation of application No. 10/016,355, filed on Oct. 29, 2001, now Pat. No. 6,624,761, which is a continuation-in-part of application No. 09/705,446, filed on Nov. 3, 2000, now Pat. No. 6,309,424, which is a continuation of application No. 09/210,491, filed on Dec. 11, 1998, now Pat. No. 6,195,024.

(60) Provisional application No. 61/641,684, filed on May 2, 2012.

(56) References Cited

U.S. PATENT DOCUMENTS

| | | | |
|---|---|---|---|
| 8,832,551 B2* | 9/2014 | Muser | G06F 3/0481 715/704 |
| 2002/0097172 A1* | 7/2002 | Fallon | 341/51 |
| 2007/0083571 A1* | 4/2007 | Meller | G06F 8/665 |
| 2008/0239917 A1* | 10/2008 | Mukaide | G11B 20/1217 369/59.26 |
| 2008/0279462 A1* | 11/2008 | Celi, Jr. | H04L 67/1095 382/232 |
| 2009/0157712 A1* | 6/2009 | De Peuter | H03M 7/30 |
| 2011/0023052 A1* | 1/2011 | Huang | H03M 7/30 719/318 |
| 2012/0124016 A1* | 5/2012 | Barsness | G06F 17/30153 707/693 |
| 2012/0239921 A1 | 9/2012 | Fallon | |

OTHER PUBLICATIONS

Fitchard, Kevin, "The Future of Mobile Networks: Beyond 4G," Businessweek.com, accessed at http://www.businessweek.com/articles/2012-12-19/the-future-of-mobile-networks-beyond-4g on May 23, 2013, 6 pages.

Quick Turn Flash, "USB Flash Drive Facts," Quickturnflash.com, accessed at http://quickturnflash.com/Flash-Drive-Resources/usb-flash-drive-facts.html on May 23, 2013, 4 pages.

Wikibooks, "Communication Networks/History of Networking," Wikibooks.org, accessed at http://en.wikibooks.org/wiki/Communication_Networks/History_of_Networking on May 23, 2013, 2 pages.

Wikipedia, "4G," Wikipedia.org, accessed at http://en.wikipedia.org/wiki/4G on May 23, 2013, 17 pages.

Wikipedia, "Central Processing Unit," Wikipedia.org, accessed at http://en.wikipedia.org/wiki/Central_processing_unit on May 23, 2013, 14 pages.

Wikipedia, "Computer Data Storage," Wikipedia.org, accessed at http://en.wikipedia.org/wiki/Computer_data_storage on May 23, 2013, 14 pages.

Wikipedia, "Database," Wikipedia.org, accessed at http://en.wikipedia.org/wiki/Database_system on May 23, 2013, 19 pages.

Wikipedia, "Orthogonal Frequency-Division Multiplexing," Wikipedia.org, accessed at http://en.wikipedia.org/wiki/Orthogonal_frequency-division_multiplexing on May 23, 2013, 13 pages.

Wikipedia, "Removable Media," Wikipedia.org, accessed at http://en.wikipedia.org/wiki/Removable_media on May 23, 2013, 2 pages.

Wikipedia, "USB Flash Drive," Wikipedia.org, accessed at http://en.wikipedia.org/wiki/USB_flash_drive on May 23, 2013, 17 pages.

* cited by examiner

Assign Huffman Code Lengths Flow 1200

CONTENT ESTIMATION DATA COMPRESSION

CROSS REFERENCE TO RELATED APPLICATION

This application is a Continuation-In-Part of U.S. application Ser. No. 14/936,312, filed on Nov. 9, 2015 which is a Continuation of U.S. application Ser. No. 14/727,309, filed on Jun. 1, 2015, which is a Continuation of U.S. patent application. Ser. No. 14/495,574, filed Sep. 24, 2014, now U.S. Pat. No. 9,054,728, which is a Continuation of U.S. patent application. Ser. No. 14/251,453, filed Apr. 11, 2014, now U.S. Pat. No. 8,933,825, which is a Continuation of U.S. patent application. Ser. No. 14/035,561, filed Sep. 24, 2013, now U.S. Pat. No. 8,717,203, which is a Continuation of U.S. patent application. Ser. No. 13/154,211, now U.S. Pat. No. 8,643,513, filed Jun. 6, 2011, which is a Continuation of U.S. patent application. Ser. No. 12/703,042, filed Feb. 9, 2010, now U.S. Pat. No. 8,502,707, which is a Continuation of both U.S. patent application. Ser. No. 11/651,366, filed Jan. 8, 2007, now abandoned, and U.S. patent application. Ser. No. 11/651,365, filed Jan. 8, 2007, now U.S. Pat. No. 7,714,747. Each of application. Ser. No. 11/651,366 and application. Ser. No. 11/651,365 is a Continuation of U.S. patent application. Ser. No. 10/668,768, filed Sep. 22, 2003, now U.S. Pat. No. 7,161,506, which is a Continuation of U.S. patent application. Ser. No. 10/016,355, filed Oct. 29, 2001, now U.S. Pat. No. 6,624,761, which is a Continuation-In-Part of U.S. patent application. Ser. No. 09/705,446, filed Nov. 3, 2000, now U.S. Pat. No. 6,309,424, which is a Continuation of U.S. patent application. Ser. No. 09/210,491, filed Dec. 11, 1998, which is now U.S. Pat. No. 6,195,024. This application also claims the benefit of U.S. Provisional Application No. 61/641,684, filed on May 2, 2012, and titled "Data Management Systems and Methods Using Compression," which is incorporated herein by reference in its entirety.

FIELD

Embodiments generally relate to data management systems. More particularly, embodiments relate to data management systems and methods using compression.

RELATED ART

Modern information theory crosses the boundaries of multiple disciplines, including communication theory. Communication theory embraces the limits of data compression (the minimum or near minimum representation of information) and communication channel capacity (the maximum or near maximum transmission of data over an existing communications channel). Thus, information theory provides tools for designing and analyzing the performance of data compression and communications channels.

There are associated processing and temporal costs with both aspects of data compression. For example, achieving more efficient representations of data and communications modulation schemes for more efficient use of channel capacity involve computation and time to allow such greater operating efficiency. Presently employed techniques for data compression and communication modulation are relatively simple, but encounter real world limitations in processing power and permitted latency. Theoretical optimal systems and techniques are presently computationally impractical. However, recent advances in processor speed have enabled the design of systems that attain at least some of the potential benefits of compression and communication technologies.

Information may be represented in a variety of manners. Discrete information such as text and numbers are easily represented in digital data. This type of data representation is known as symbolic digital data. Symbolic digital data is thus a representation of data such as a letter, figure, character, mark, machine code, or drawing, Continuous information such as speech, music, audio, images and video, frequently exists in the natural world as analog information. Recent advances in very large scale integration (VLSI) digital computer technology have enabled both discrete and analog information to be represented with digital data. Continuous information represented as digital data is often referred to as diffuse data. Diffuse digital data is thus a representation of data that is of low information density and is typically not easily recognizable to humans in its native form.

There are many advantages associated with digital data representation. For instance, digital data is more readily processed, stored, and transmitted due to its inherently high noise immunity. In addition, the inclusion of redundancy in digital data representation enables error detection and/or correction. Error detection and/or correction capabilities are dependent upon the amount and type of data redundancy, available error detection and correction processing, and extent of data corruption.

One outcome of digital data representation is the continuing need for increased capacity in data processing, storage, and transmittal. This is especially true for diffuse data where increases in fidelity and resolution create exponentially greater quantities of data. Data compression is widely used to reduce the amount of data required to process, transmit, or store a given quantity of information. In general, there are two types of data compression techniques that may be utilized either separately or jointly to encode/decode data: lossless and lossy data compression.

Lossy data compression techniques provide for an inexact representation of the original uncompressed data such that the decoded (or reconstructed) data differs from the original unencoded/uncompressed data. Lossy data compression is also known as irreversible or noisy compression. Entropy is defined as the quantity of information in a given set of data. Thus, an advantage of lossy data compression is that the compression ratios can be larger than the entropy limit, all at the expense of information content. Many lossy data compression techniques seek to exploit various traits within the human senses to eliminate otherwise imperceptible data. For example, lossy data compression of visual imagery might seek to delete information content in excess of the display resolution or contrast ratio.

On the other hand, lossless data compression techniques provide an exact representation of the original uncompressed data. Simply stated, the decoded (or reconstructed) data is identical to the original unencoded/uncompressed data. Lossless data compression is also known as reversible or noiseless compression. Thus, lossless data compression has, as its current limit, a minimum representation defined by the entropy of a given data set.

There are various problems associated with the use of lossless compression techniques. One fundamental problem encountered with most lossless data compression techniques is their content sensitive behavior. This is often referred to as data dependency. Data dependency implies that the compression ratio achieved is highly contingent upon the content of the data being compressed. For example, database files often have large unused fields and high data redundancies, offering the opportunity to losslessly compress data at ratios of 5 to 1 or more. In contrast, concise software programs have little to no data redundancy and, typically, will not losslessly compress better than 2 to 1.

Another problem with lossless compression is that there are significant variations in the compression ratio obtained when using a single lossless data compression technique for data streams having different data content and data size. This process is known as natural variation.

A further problem is that negative compression may occur when certain data compression techniques act upon many types of highly compressed data. Highly compressed data appears random and many data compression techniques will substantially expand, not compress this type of data.

For a given application, there are many factors that govern the applicability of various data compression techniques. These factors include compression ratio, encoding and decoding processing requirements, encoding and decoding time delays, compatibility with existing standards, and implementation complexity and cost, along with the adaptability and robustness to variations in input data. A direct relationship exists between compression ratio and the amount and complexity of processing required. One of the limiting factors in many lossless data compression techniques is the rate at which the encoding and decoding processes are performed. Hardware and software implementation tradeoffs are often dictated by encoder and decoder complexity along with cost.

Another problem associated with lossless compression methods is determining the optimal compression technique for a given set of input data and intended application. To combat this problem, there are many conventional content dependent techniques that may be utilized. For instance, file type descriptors are typically appended to file names to describe the application programs that normally act upon the data contained within the file. In this manner data types, data structures, and formats within a given file may be ascertained. Fundamental limitations with this content dependent technique include: (1) the extremely large number of application programs, some of which do not possess published or documented file formats, data structures, or data type descriptors; (2) the ability for any data compression supplier or consortium to acquire, store, and access the vast amounts of data required to identify known file descriptors and associated data types, data structures, and formats; and (3) the rate at which new application programs are developed and the need to update file format data descriptions accordingly.

Yet another problem is the ability to identify data types within a data stream and to identify optimal sets or groupings of data to achieve optimal compression within a given time interval. These and other limitations are addressed by the current disclosure.

Processors

Processors utilize a variety of architectures and configurations to achieve their intended functionalities. For example, processors may have broad highly reprogrammable functionalities implemented by a variety of subcomponents. For example, one subcomponent may include as a Central Processing Unit (CPU). A CPU is an electronic circuit that executes computer programs, typically containing a processing unit and a control unit with the processing unit. In an example Von Neumann computer architecture, the CPU may be integrated with other computational hardware that may contain an arithmetic logic unit (ALU) and processor registers, or a Microprocessor (MPU), which is a way of providing a CPU on one silicon chip as part of a microcomputer.

In addition, processors may have constituent subsystems with more targeted functionalities, such as a Graphics Processing Unit (GPU), alternatively known as a Video Processing Unit (VPU), a dedicated graphics rendering device for a personal computer or game console, a Physics Processing Unit (PPU), a dedicated microprocessor designed to handle the calculations of physics (which may be required, for example, by a simulation program), a Digital Signal Processor (DSP), a specialized microprocessor designed specifically for digital signal processing, a Network Processor Unit (NPU), a microprocessor specifically targeted at the networking application domain, a Front End Processor (FEP), a helper processor for communication between a host computer and other devices, a Coprocessor (CoP), a supplementary processor that is often used in conjunction with a CPU or DSP for dedicated tasks such as floating point calculations, and/or a Data Processing Unit (DPU), a system that translates or converts between different data formats.

Regardless of the processor type, each processor needs one or more mechanisms for processing data. There are a wide variety of potential mechanisms that may provide such functionality. The functionality that is actually used may range from simple approaches such as a basic Turing Machine (TM) to a complex High Parallelized Random Access Stored Program Machine (RASP).

For any machine architecture that is used to implement a processor, each machine must operate on a symbolic representation of the information that it processes. Most current processors utilize binary data representations which associate one or more data sets and/or data types to one or more binary values. These binary values can subsequently be used in processing of the data to derive conclusions based on the data that they represent.

Memory Devices

Modern computers utilize a hierarchy of memory devices. To achieve maximum performance levels, modern processors utilize onboard memory and on-board caches to obtain high bandwidth access to both programs and data (which, for example, may include document data or other data that may be manipulated or otherwise processed by the programs). Limitations in process technologies currently prohibit placing a sufficient quantity of onboard memory on the processor itself for most applications. Thus, in order to offer sufficient memory for the operating system(s), application programs, and user data that they manipulate, computers often use various forms of popular off-processor high speed memory. For example, such high speed memory may include static random access memory (SRAM), synchronous dynamic random access memory (SDRAM), and/or synchronous burst static ram (SBSRAM). Due to the prohibitive cost of the high-speed random access memory, coupled with their power volatility, a third lower level of the hierarchy exists for non-volatile mass storage devices.

Memory can be volatile, such as DRAM (Dynamic-RAM), which can be used for primary data storage, or nonvolatile memory which is often used in secondary and tertiary memory. Both volatile and non-volatile memory exist in a wide variety of forms and can be used for primary, secondary, or tertiary storage dependent upon system requirements. Secondary and tertiary storage, examples of which are hard disk drives, optical disc drives, and other devices (for example, tape drives) are typically slower than RAM but are typically non-volatile.

Many different forms of storage, based on various technologies, are available. So far, no practical universal storage medium exists (that is, a medium that is ideally adapted to all storage goals). This situation results from the fact that all forms of storage have some drawbacks or limitations. Therefore a computer system usually contains several types of storage, each of which is included in the computer system to address an individual purpose and/or storage need.

As briefly discussed above, most modern digital computers utilize the binary number system. Text, numbers, pictures, video, and audio, and nearly any other form of information can be converted into a string of bits, or binary digits, each of which has a value of 1 or 0. In addition, many modern computers are Von Neumann machines that possess memory that stores both operating instructions and data. Such computers are relatively more versatile that other possible computing architectures in that they do not need to have their hardware reconfigured for each new program, but can simply be reprogrammed with new in-memory instructions. Computers designed to be Von Neumann machines also tend to be simpler to design, in that a relatively simple processor may keep state between successive computations to build up complex procedural results.

In practice, computers use a variety of memory types, organized in a storage hierarchy around the CPU, as a trade-off between performance and cost. In other words, memory is included in tiers, such that the system includes small amounts of costly, high-performance memory for the most critical tasks, but the system also includes larger amount of memory that may be slower, but may also be cheaper and/or nonvolatile. Generally, the lower a memory storage device is in the hierarchy, it possesses a lower data storage rate, but a significantly lower cost per stored bit, and generally a greater storage density and total storage capacity.

The ubiquity of the Internet, combined with new multimedia applications has put tremendous emphasis on storage volumetric density, storage mass density, bandwidth, and power consumption. Specifically, storage density is limited by the number of bits that are encoded in a mass storage device per unit volume. Similarly, mass density is defined as storage bits per unit mass. Bandwidth is the data rate at which the data may be accessed. A goal of storage technologies is to optimize these characteristics for a given storage technology, because it can help performance and cost of storage technologies.

Power consumption for a storage technology is canonically defined in terms of power consumption per bit and may be specified under a number of operating modes including active (while data is being accessed and transmitted) and standby mode. Hence, one fairly obvious limitation within the current art is the need for even more volume, mass, and power efficient data storage to provide the performance needs of present-day computing applications.

Removable Media

In the context of computer storage, removable media refers to storage media that are designed to be portable. Some forms of removable media may be removed without damage or degradation from a computer without powering the computer off. Some types of removable media are designed to be read by removable readers and drives. Examples include: Optical discs (Blu-ray discs, DVDs, CDs), memory cards (CompactFlash card, Secure Digital card, Memory Stick, USB Flash Drives), floppy disks/zip disks, magnetic tapes and paper data storage (punched cards, punched tapes).

Some removable media readers and drives are integrated into computers, others are themselves removable. Removable media may also refer to some removable memory devices, when they are used to transport or store data. Examples include: USB flash drives and external hard disk drives. Many types of removable media can have either external or removable media readers. If the media is both read and write capable external readers may have one or both capabilities.

Removable media offers a way to store data that needs to be physically transported from place to place. For example, removable media may be important for an offsite backup, or for transferring data from one machine to another. Another aspect of removable media is that it makes increasing availability to storage relatively easy. While an internal hard drive maintains a set capacity, it is very easy to remove a USB thumb drive and replace it and/or add another when additional storage becomes necessary. In addition removable storage may have a lower cost or even reduced latency when compared to available data transmission systems.

USB Flash Drives

A USB flash drive (known colloquially as a "thumb drive") is a data storage device that typically includes flash memory with an integrated Universal Serial Bus (USB) interface. USB flash drives are typically removable and rewritable, and physically much smaller than a traditional 3½ inch floppy disk. Most weigh less than 30 grams although they come in many forms, some with highly decorative enclosures. Drives of this type vary in density, from 256 GB to 2 terabytes and beyond, with steady improvements in size and price per capacity expected. Some USB flash drives allow up to 100,000 write/erase cycles (depending on the exact type of memory chip used) and 10 years shelf storage time. Significant improvements are anticipated.

USB flash drives are often used for the same type of purposes for which floppy disks or CD-ROMs were used. They are smaller, faster, have thousands of times more capacity, and are more durable and reliable because they have no moving parts. Until approximately 2005, most desktop and laptop computers were supplied with floppy disk drives, but floppy disk drives have been largely abandoned in favor of USB ports. USB ports can also be utilized to interface to a wide variety of devices including keyboards, mice, and both local area and wide area network adapters.

USB flash drives use the USB mass storage standard, supported natively by modern operating systems such as Linux, Mac OS X, Windows, and other Unix-like systems, as well as many BIOS boot ROMs. USB drives with USB 2.0 support can store more data and transfer faster than much larger optical disc drives like CD-RW or DVD-RW drives and can be read by many other systems such as the Microsoft Xbox 360 game console, Sony PlayStation 3 game console, DVD players and in some upcoming mobile smartphones. In addition, some USB drives support the more modern USB 3.0 standard, which offers the potential for even greater performance.

USB flash drives are typically mechanically static devices, i.e. nothing moves mechanically in a flash drive; the term drive persists because computers read and write flash drive data using the same system commands as for a mechanical disk drive, with the storage appearing to the computer operating system and user interface as just another drive. Flash drives are robust mechanically, in that their lack of moving parts improves reliability and sturdiness.

A flash drive consists of a small printed circuit board carrying the circuit elements of its memory and memory interface architecture and a USB connector, insulated electrically and protected inside a plastic, metal, or rubberized case which can be carried in a pocket or on a key chain, for example. The USB connector may be protected by a removable cap or by retracting into the body of the drive, although it is not likely to be damaged if unprotected. Most flash drives use a standard type-A USB connection allowing plugging into a port on a personal computer, but drives for other interfaces also exist.

USB flash drives draw their power from the computer via the USB connection. Some devices combine the functionality of a digital audio or video player with USB flash storage; but such devices often require a battery or external power adapter only when used to play music or video.

External Removable Drives

External removable hard disk drives offer independence from system integration (in that storage can be implemented as an adjunct to the system, rather than a subcomponent) by establishing communication with the rest of the system via connectivity options, such as USB. Plug and play drive functionality offers system compatibility, and features large volume data storage options, but maintains a portable design. These drives, with an ability to function and be removed simplistically, have had further applications due their flexibility. These include: disk cloning, data storage, data recovery, backup of files and information, storing and running virtual machines, scratch disk/temporary storage for video editing applications and video recording, booting operating systems (e.g., Linux, Windows, Windows To Go—a.k.a. Live USB).

External hard disk drives are available in two main sizes (physical size), 2.5" and 3.5". Capacities of such devices generally range from 160 GB to 2 TB, with common sizes being 160 GB, 250 GB, 320 GB, 500 GB, 640 GB, 1 TB, and 2 TB. Much greater storage capacities for external hard disk drives are anticipated.

External hard disk drives are available as preassembled integrated products, or may be assembled by the end-user by combining an external enclosure (with appropriate interface—e.g., USB and other support aspects, such as a power supply) with a separately-purchased normal, bare, internal hard disk drive.

Additional interfaces such as Thunderbolt, USB 3.0, Firewire 400, and Firewire 800, are often incorporated into higher performance storage devices. These interfaces allow even more rapid data transfer than USB 2.0 and other older interface schemes such as Small Systems Computer Interface (SCSI) and Advanced Technology Attachment (ATA).

Magnetic disk mass storage devices currently employed in a variety of home, business, and scientific computing applications suffer from significant seek-time access delays along with profound read/write data rate limitations. Currently, the fastest available magnetic disk drives support only a sustained output data rate in the low 100's of megabytes per second data rate (MB/sec). This is in stark contrast to the Personal Computer's Peripheral Component Interconnect (PCIe) Bus' output date rate of 1 Gigabytes per second serial bus with up to 48 PCIe simultaneous interface capabilities and the modern computer internal local bus capabilities of well over 6.8 Gigabytes per second. Furthermore, other internal architectures for PC buses offer the potential to support considerably faster bus capabilities. Clearly, relying on the speed that mass storage devices offer can cause large delays as computing system must wait for the delays caused by relatively slow mass storage devices.

Another problem is that disk interface standards such as the Small Computer Systems Interface (SCSI-3), Fibre Channel, AT Attachment UltraDMA/66/100, Serial Storage Architecture, and Universal Serial Bus offer only higher data transfer rates through intermediate data buffering in random access memory. These interconnect strategies do not address the fundamental problem that all modern mass devices for the personal computer marketplace are limited by the same typical physical media restrictions. In practice, faster disk access data rates are achieved by the high cost solution of simultaneously accessing multiple disk drives with a technique known within the art as data striping and redundant array of independent disks (RAID).

RAID systems often afford the user the benefit of increased data bandwidth for data storage and retrieval. By simultaneously accessing two or more disk drives, data bandwidth may be increased at a maximum rate that is linear and directly proportional to the number of disks employed. Thus, another problem with modern data storage systems utilizing RAID systems is that a linear increase in data bandwidth requires at least a proportional number of added disk storage devices.

Another problem with many modern mass storage devices is their inherent unreliability. Many modern mass storage devices still utilize rotating assemblies and other types of electromechanical components that possess failure rates one or more orders of magnitude higher than equivalent solid-state devices. The mechanical nature of such devices can cause this failure rate, as various parts may wear out or crash due to their delicate nature. RAID systems employ data redundancy distributed across multiple disks to enhance data storage and retrieval reliability. In the simplest case, data may be explicitly repeated on multiple places on a single disk drive, on multiple places on two or more independent disk drives. More complex techniques are also employed that support various trade-offs between data bandwidth and data reliability. For example, RAID configurations may use part of the redundancy to help improve speed, and part of the redundancy to help as a form of backup.

Standard types of RAID systems include RAID Levels 0, 1, and 5 (among others). The configuration selected depends on the storage goals to be achieved. Specifically, data reliability, data validation, data storage/retrieval bandwidth, and cost all play a role in defining the appropriate RAID data storage solution. RAID level 0 entails pure data striping across multiple disk drives. This increases data bandwidth at best linearly with the number of disk drives utilized. Data reliability and validation capability are decreased. A failure of a single drive results in a complete loss of all data (as there are no backups built into this form of RAID). Thus, another problem with RAID systems is that low cost improved bandwidth requires a significant decrease in reliability.

RAID Level 1 utilizes disk mirroring, in which data from a main storage disk is duplicated on an independent disk's subsystem. This duplicate is a "mirror," because each drive stores the same data in parallel. Validation of data amongst the two independent drives is possible if the data is simultaneously accessed on both disks and subsequently compared. This tends to decrease data bandwidth from even that of a single comparable disk drive due to the necessity of coordinating reads and writes.

However, the advantage of this approach is that if one disk becomes nonfunctional, another disk is always potentially available to replace it. For example, in systems that offer hot swap capability, the failed drive is removed and a replacement drive is inserted. The data on the failed drive is then copied in the background while the entire system continues to operate in a performance degraded but fully operational mode. Once the data rebuild is complete, normal operation resumes. Hence, another problem with RAID systems is the high cost of increased reliability and associated decrease in performance. RAID Level 1 can offer better reliability, but it requires additional drives and has attendant performance issues.

RAID Level 5 employs disk data striping and parity error detection to increase both data bandwidth and reliability simultaneously. A minimum of three disk drives is required for this technique. In the event of a single disk drive failure, that drive may be rebuilt from parity and other data encoded on remaining disk drives. In systems that offer hot swap capability, the failed drive is removed and a replacement drive is inserted. The data on the failed drive is then rebuilt in the background while the entire system continues to operate in a performance degraded but fully operational mode. Once the data rebuild is complete, normal operation resumes. While this approach can improve speed and reliability to some extent, it is not a perfect solution and it is still a costly option due to the need for multiple disk drives and the need to coordinate storage between the disk drives.

Thus another problem with redundant modern mass storage devices is the degradation of data bandwidth when a storage device fails. Additional problems with bandwidth limitations and reliability similarly occur by all other forms of sequential, pseudo-random, and random access mass storage devices. These and other limitations are addressed by the current disclosure.

No disclosure in the Related Art Section is an admission of prior art.

SUMMARY

Embodiments of the present disclosure are directed to systems and methods for providing fast and efficient data compression using a combination of content dependent, content estimation, and content independent data compression. In one aspect of the disclosure a method for compressing data comprises the steps of: analyzing a data block of an input data stream to identify a data type of the data block, the input data stream comprising a plurality of disparate data types; performing content dependent data compression on the data block, if the data type of the data block is identified; performing content estimation data compression if the content is estimable; and performing content independent data compression on the data block, if the data type of the data block is not identified or estimable.

In one aspect of the present disclosure, the step of performing content dependent compression comprises the steps of: receiving an input data block, parsing the data, identifying the data type, accumulating the data by data type, selecting one or more encoders associated with the identified data type and encoding the data block with the selected encoders to provide a one or more encoded data blocks; determining a compression ratio obtained for each of the selected encoder(s), optionally comparing each of the determined compression ratios with a compression threshold, and optionally selecting for output the encoded data block having the highest compression ratio and associating a corresponding compression type descriptor or identifier with the selected encoded data block, if at least one of the compression ratios meet the compression threshold, and optionally applying content estimation or content independent data compression if the input data block is not parsable or estimable.

In yet another aspect of the present disclosure performing content estimation data compression LZDR compression is applied to a data block and stored into internal buffers. While compressing, LZDR encoder accumulates statistics used to choose the actual compression method. The statistics from LZDR encoder are used to estimate the compressed data size for multiple different types of compression. The estimated results are optionally compared to the compressed data size estimated by LZDR and also the size of the original un-encoded data block. The method providing the smallest data, encoded or un-encoded, is selected. A tie breaking system is provided which provides a hierarchical selection process for identical results. Desirability factors can also be utilized to provide tiebreaking or indeed have different thresholds for selection of various compression encoders. Compression encoders and parameters, such as fixed or adaptive Huffman Tables may be preselected based upon a priori knowledge of the statistics for various files types or portions thereof. Thus the statistics computed by the LZDR encoder are employed to effectively estimate the file type or portion thereof by selecting the optimal encoder or encoders to compress the input data block.

In another aspect of the present disclosure, the step of performing content independent data compression comprises: encoding the data block with a plurality of encoders to provide a plurality of encoded data blocks; determining a compression ratio obtained for each of the encoders; comparing each of the determined compression ratios with a first compression threshold; selecting for output the input data block and appending a null compression descriptor to the input data block, if all of the encoder compression ratios do not meet the first compression threshold; and selecting for output the encoded data block having the highest compression ratio and appending a corresponding compression type descriptor to the selected encoded data block, if at least one of the compression ratios meet the first compression threshold.

In yet another aspect, the step of performing content independent data compression on the data block, if the data type of the data block is not identified, comprises the steps of: estimating a desirability of using of one or more encoder types based on characteristics of the data block; and compressing the data block using one or more desirable encoders.

In another aspect, the step of performing content dependent data compression on the data block, if the data type of the data block is identified, comprises the steps of: estimating the desirability of using of one or more encoder types based on characteristics of the data block; and compressing the data block using one or more desirable encoders.

In another aspect, the step of analyzing the data block comprises analyzing the data block to recognize one of a data type, data structure, data block format, file substructure, and/or file types. A further step comprises maintaining an association between encoder types and data types, data structures, data block formats, file substructure, and/or file types.

These and other aspects, features and advantages of the disclosure will become apparent from the following detailed description of preferred embodiments, which is to be read in connection with the accompanying drawings.

BRIEF DESCRIPTION OF THE DRAWINGS

The accompanying drawings, which are incorporated herein and form a part of the specification, illustrate embodiments of the present invention and, together with the description, further serve to explain the embodiments and to enable a person skilled in the relevant art to make and use the invention.

Figure 1:
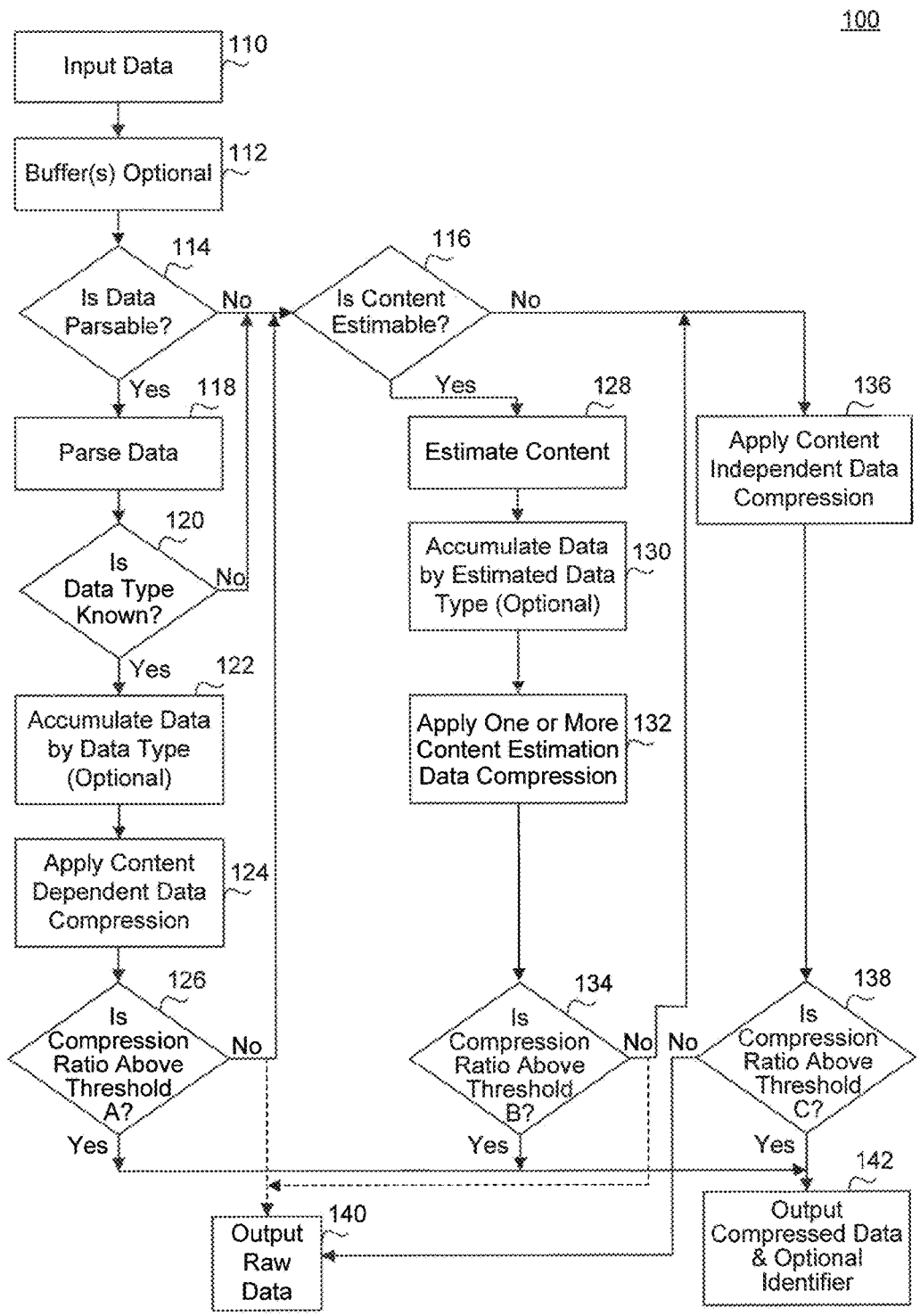
FIG. 1 is an illustration of a flow diagram of a combined content dependent, content estimation, and content independent data compression according to an embodiment.

Embodiments will now be described with reference to the accompanying drawings. In the drawings, generally, like reference numbers indicate identical or functionally similar elements. Additionally, generally, the left-most digit(s) of a reference number identifies the drawing in which the reference number first appears.

DETAILED DESCRIPTION

The following detailed description refers to the accompanying drawings that illustrate example embodiments consistent with this invention. Other embodiments are possible, and modifications can be made to the embodiments within the spirit and scope of the disclosure herein. Therefore, the detailed description is not meant to limit the scope of the invention. Rather, the scope of the invention is defined by the appended claims.

It would be apparent to a person skilled in the relevant art that the embodiments, as described below, can be implemented in many different forms of software, hardware, firmware, and/or the entities illustrated in the figures. Thus, the operational behavior of embodiments of the present invention will be described with the understanding that modifications and variations of the embodiments are possible, given the level of detail presented herein.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of a person skilled in the relevant art to effect such feature, structure, or characteristic in connection with other embodiments whether or not explicitly described.

The field of this technology includes data compression and data acceleration for data processing, data transmission, data storage, and data retrieval. In embodiments systems and methods for content estimation data compression are described.

Terminology:

For the purposes of this disclosure and the description of the below embodiments, the following terminology will be used throughout.

A dictionary encoder is one of a class of lossless data compression algorithms that operate by searching for matches between data to be compressed and a set of strings of data contained in a data structure (called the "dictionary") maintained by the encoder. When the encoder finds such a match, it may substitute a reference to the string's position in the data structure.

In LZ77 (Lempel-Ziv 77), compression uses a dictionary encoder in which the dictionary indexes into the previously seen data and a match is coded as a match length and offset to the start of the matching string.

In run length encoding, runs of a single character are encoded as a run length and the run character.

An entropy encoder is a lossless data compression scheme which replaces input codes of fixed lengths by prefix-free (no prefix of one code matches another code) codes of a varying number of bits. The codes are chosen so that the length of the code for symbol S is approximately $-\log 2(P(S))$, where $P(S)$ is the probability of the symbol S in the data stream.

The encoding may be the same for all input (static codes) or it may be computed for each block to be compressed (dynamic codes). In the case of dynamic codes, information must be included in the compressed data to allow reconstructing the codes for decompression.

Huffman coding uses a particular algorithm to choose an encoding which is optimal among bit aligned codes. However, some embodiments may use a slightly sub-optimal algorithm for choosing codes which runs faster. In what follows, the specification will use "Huffman coding" as a generic term for entropy encoding with the sub-optimal coding tables. However, examples are not so limited and "Huffman coding" may also include other Huffman coding algorithms.

MSBit(x) for a non-negative integer x is 0 if x is 0. It is the location of the most significant bit of x (counting from 1) otherwise. Note that this determination, in the context of this specification, is one more than the usual bit numbering to allow for 0 values.

Coding Integer Values in the Bit Stream of an Entropy Encoder: In applying an entropy encoder to the results of another encoder (to the output of LZ77 for instance), it is necessary to encode the values of match lengths and offsets in the bit stream. This goal may be accomplished by having a code for each possible MSBit of a match length and separate codes for each possible MSBit of an offset. The value is encoded by outputting the code for the MSBit immediately followed by the remaining (MSBit−1) bits of the value. This approach is illustrated graphically, below.

| Remaining bits of value | Code for MSBit of value |

For example, to encode a run length of 41, the encoding may be accomplished by [encoding run length]−4=37=100101 (since the minimum run length is 4). It is possible to get the code for a run MSBit of 6 (say 10 bits long 0101111111) and append the extra bits 00101 to get 15 bits total 00101 0101111111. In this and all bit strings, the least significant bit is the first bit processed and is shown on the right end of the bit string. The input bits read right to left.

It is to be understood that a system processes the input data in data blocks that may range in size from individual bits through complete files or collections of multiple files. Additionally, the data block size may be fixed or variable.

Compression Overview

Data compression maybe utilized to store, retrieve and transmit data more efficiently, with lower latency, and/or in an accelerated manner. As presented in this disclosure, many different approaches may be used to facilitate these various types of data compression in various embodiments.

As shown in FIG. 1 a method 100 for compressing data comprises the steps of: analyzing a data block of an input data stream to identify a data type of the data block, the input data stream comprising a plurality of disparate data types; performing content dependent data compression on the data block, if the data type of the data block is identified; performing content estimation data compression if the content is estimable; and performing content independent data compression on the data block, if the data type of the data block is not identified or estimable.

Referring now to FIG. 1, a flow diagram illustrates a method for content dependent, content estimation, and content independent data compression in accordance with an embodiment of the present disclosure. Example systems and methods for content independent and content dependent data compression and decompression are described in U.S. Pat. No. 6,309,424, titled "Content Independent Data Compression Method and System," filed Nov. 3, 2000, and U.S. Pat. No. 6,624,761, titled "Content Independent Data Compression Method and System," filed Oct. 29, 2001, both of which are incorporated herein by reference in their entireties.

As shown in FIG. 1, an input data block is received in step 110 and optionally buffered in step 112. It should be noted that data may be received or retrieved in any manner including receiving an input data stream, retrieving input data through direct memory access, or any other manner of obtaining data to process including, but not limited to, receiving or retrieving data. The input data blocks may range in size from individual bits through complete files or collections of multiple files, and the data block size may be fixed or variable. In addition while buffering is shown between receiving data in step 110 and the test for data parsable in step 114, buffering may be applied before or after in any element of the flow diagram in FIG. 1.

A test is performed for to see if the data block is parsable in step 114, and if the data block is parsable it is then parsed in step 118. It should be noted that the parsing of data can be performed by any of the many techniques well known in the art, for example locating identifiers in the data that signal the end of a data string, or as an additional example using a priori known data structures with fixed or variable lengths for given data fields.

Once the data block has been parsed a check is performed to see if the data type of some or all of the parsed data is known in step 120. Data type is any parameter or attribute of the data. If the data type is known the parsed data may optionally be accumulated by data type in step 122 to provide larger blocks of data for the encoder to process that provides an opportunity to achieve larger data sets for the encoder to process that can lead to higher compression ratios often at the expense of longer data accumulation and processing times.

Content dependent data compression is then applied in step 124 using one or more associated encoders to compress the parsed data. For example, an encoder associated with the known data type can compress the parsed data. Further examples of content dependent data compression techniques can be found in U.S. Pat. No. 6,624,761, titled "Content Independent Data Compression Method and System," filed Oct. 29, 2001, which is incorporated herein by reference in its entirety. An optional test is performed to see if the compression ratio is above Threshold A in step 126, and if the compression of the encoded parsed data is above the threshold it is output or stored with an optional identifier in step 142 indicating which encoder has been applied (if any) and any associated parameters including the type of compression that was applied. It should be noted that the identifier is any recognizable data token or descriptor that indicates which encoder has been applied (if any) and any associated parameters including the type of compression that was applied. It does not have to be appended to the data but may be accomplished by any means including outputting the data to different memory locations or output devices.

If the data was not parsable in step 114, or if the data type is unknown in step 120, or if the compression ratio was not above the threshold in step 126, the input data block or portion thereof is tested to see if the content may be estimated in step 116. Optionally if the compression ratio was not above Threshold A in step 126 the raw un-encoded input data block or portion thereof is output in step 140 or otherwise made available instead of tested to see if the content may be estimated in step 116. This may be due to the unavailability of other techniques in FIG. 1 such as content estimation and content independent data compression or it may be due to design considerations for the types of input data received.

Once the test for estimable content in step 116 is performed and the result is affirmative, the data block or portion thereof is then estimated in step 128 by one or more content estimation techniques discussed within the present disclosure. The estimated data may be optionally accumulated in step 130 to provide a larger data set for the encoder to process that provides an opportunity to achieve larger data sets for the encoder to process that can lead to higher compression ratios often at the expense of longer data accumulation and processing times.

One or more content estimation data encoders are selected based upon the estimation process and are applied to encode the estimated data in step 132.

An optional test is performed to see if the compression ratio is above Threshold B in step 134, and if the compression ratio of the encoded data is above the threshold it is output or stored with an optional identifier in step 142 indicating which encoder has been applied (if any) and any associated parameters including the type of compression that was applied.

If the data was not estimable in step 116, or if the compression ratio was not above the threshold in step 134, content independent data compression in step 136 is applied. Optionally if the compression ratio was not above Threshold B in step 134 the raw un-encoded input data block or portion thereof is output in step 140 or otherwise made available instead applying content independent data compression. For example, different encoders may be applied to compress the parsed data. Further examples of content independent data compression can be found in U.S. Pat. No. 6,309,424, titled "Content Independent Data Compression Method and System," filed Nov. 3, 2000, which is incorporated herein by reference in its entirety. This may be due to the unavailability of other techniques in FIG. 1 such as content estimation or content dependent data compression or it may be due to design considerations for the types of input data received.

If content independent data compression is applied in step 136 a test is performed to see if the compression ratio is above Threshold C in step 138, and if the compression ratio of the encoded data is above the threshold it is output or stored with an optional identifier in step 142 indicating which encoder has been applied (if any) and any associated parameters including the type of compression that was applied.

It should be noted that Optional Thresholds A in step 126 and B in step 134, and Threshold C in step 138 may be identical or distinct. In addition the threshold values may be the same or different and may utilize values that prevent data expansion or are tiered to provide optimal or near compression of data.

Figure 2:
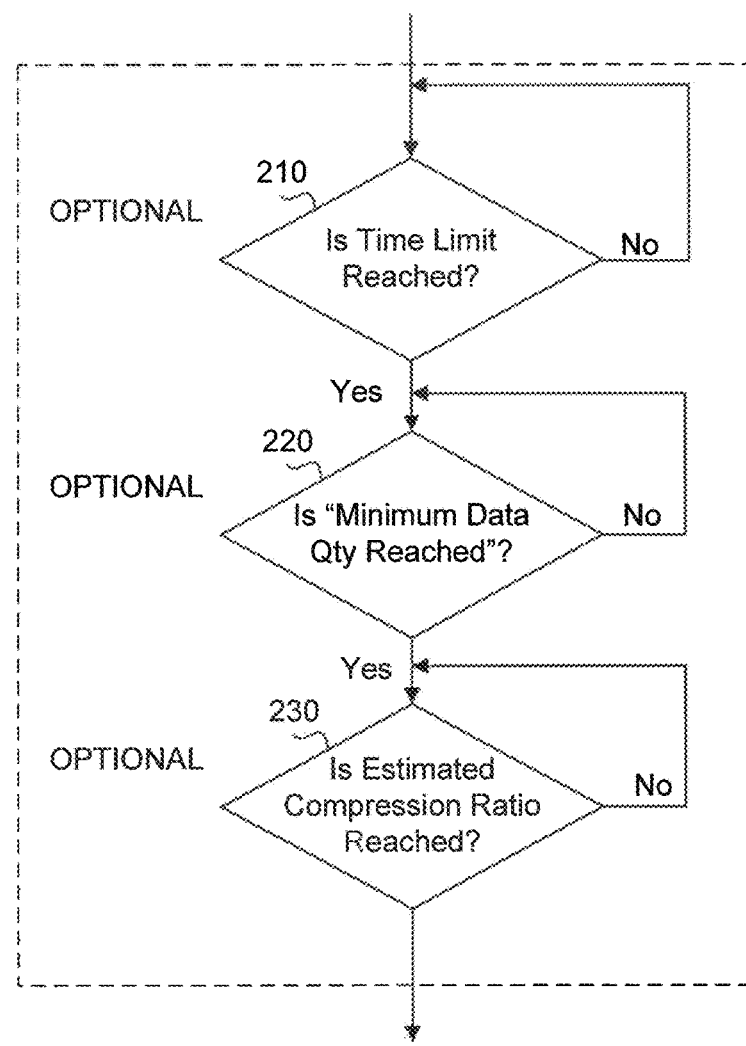
FIG. 2 is an illustration of a flow diagram of a buffering methodology in accordance with an embodiment.

As shown in FIG. 2, various forms of buffering may be applied to the input data blocks included accumulating data by data types, time limits, or estimated compression ratios.

FIG. 2 is a flow diagram 200 illustrates various methods for buffering and accumulating data. It should be noted that the present disclosure is not limited to these techniques but may use any buffering techniques that are well known in the art. Referring now to FIG. 2, an optional test for accumulating data by time period in step 210. The time period may be fixed or variable, and it may be changed by external parameters or based upon achieved compression ratios or any other parameter of the system.

Similarly an optional test for Minimum Quantity of Data may be performed in step 220. The minimum quantity of data may be by overall quantity of data, by a quantity of one or more specific data types including estimable data and unknown data type. Once again the minimum data quantity may be fixed or variable, and it may be change by external parameters or based upon achieved compression ratios or any other parameter of the system.

Additionally an optional test for achieving a compression ratio may be performed in step 230. If the compression ratio is not achieved additional data may be accumulated and larger blocks data blocks encoded to try and achieve the compression ratio. Once again compression ratio be fixed or variable, and it may be change by external parameters or based upon compression ratios achieved in other portions of the data compression system or any other parameter of the system.

The above optional tests may be combined in any manner, for example waiting for a minimum quantity of data to be reached in step 220 may also have an associated time limit, with either event triggering movement to the next step of the compression process.

In the context of one embodiment of content estimation data compression, there are 8 possible compression type return codes for the (attempted) compression of a data block. These identified codes (presented in Table 1, below) are examples which may appear in the context of one embodiment that uses return codes for how a data block was compressed, using various compression approaches discussed above. It should be noted that return codes are not a required element of the present disclosure.

TABLE 1

| Return Code | Compression Type |
|---|---|
| 0 | No compression. |
| 1 | LZDR compression (includes a combination of LZ77 + run length encoding). |
| 2 | Dynamic Huffman compression of the output of LZDR using a single table for literals and run length MSBit codes and termination codes. Matches are ignored in this approach. |
| 3 | Huffman compression of the output of LZDR using dynamic Huffman compression of literals, a separate fixed Huffman table for run length MSBit codes, match length MSBit codes, literal count MSBit codes and termination code. A separate fixed table is used for offset MSBit codes. |
| 4 | Dynamic Huffman compression of the output of LZDR using a single table combining literals, run length MSBit codes, match length MSBit codes and termination code. A separate fixed table is used for offset MSBit codes. |
| 5 | Same as type 3 except uses a fixed Huffman table for literals tuned for text files. |
| 6 | Same as type 3 except uses a fixed Huffman table for literals tuned for pdf type files. |
| 7 | Same as type 3 except uses a fixed Huffman table for literals tuned for executable files. |

In addition, the block to be compressed may be split into 1, 2 or 4, or n equal sized sub-blocks to take advantage of multiple processing units. Non-equal sub-blocks in any number are also permissible to take advantage of multiple processing units. Multiple processing units may be run in any form of concurrency or parallelism to reduce processing time, either on the same block or on sub-blocks.

In one embodiment each compressed block or sub-block ends with a termination code. Because of the termination code, it is not necessary to know the exact length of the compressed sub-block to decompress it.

In yet another embodiment the stored compressed block contains (in order) the following parts:

A. An 8 byte storage header that provides compression type, number of processors used to compress, number of sectors in the uncompressed block and number of sectors in the compressed block.

B. A (possibly empty) compression header containing offsets to sub-blocks 2, 3 and 4, if they exist. Also, for methods which use dynamic Huffman compression, the number of bits in each Huffman code (4 bits per code).

C. Compressed sub-block 1.

D. Compressed sub-blocks 2, 3 and 4 (if any) in order.

It should be noted that A through D above is for one particular embodiment and the presence of any element including headers, and their associated content compression methods, and number of blocks or sub-blocks and any other factors may be varied to suit a particular embodiment.

Assuming the compression is utilized with another program or subroutine, the caller, which is the program that needs compression to occur, passes in a data structure into the compression encoder(s) which is filled in by the compression routine and the caller constructs the final compressed block using the following information:

The compressed size in bytes.
The uncompressed size in sectors.
The number of processors used.
The address and size of the compression header if any.
The address and size of the first sub-block of compressed data.
The address and size of each subsequent sub-block of compressed data (if any).
It should again be noted that the inclusion above is for one particular embodiment and the presence of any element or they values that they may contain any other factors may be varied to suit a particular embodiment.

Estimation Compression Flow Overview

Figure 3:
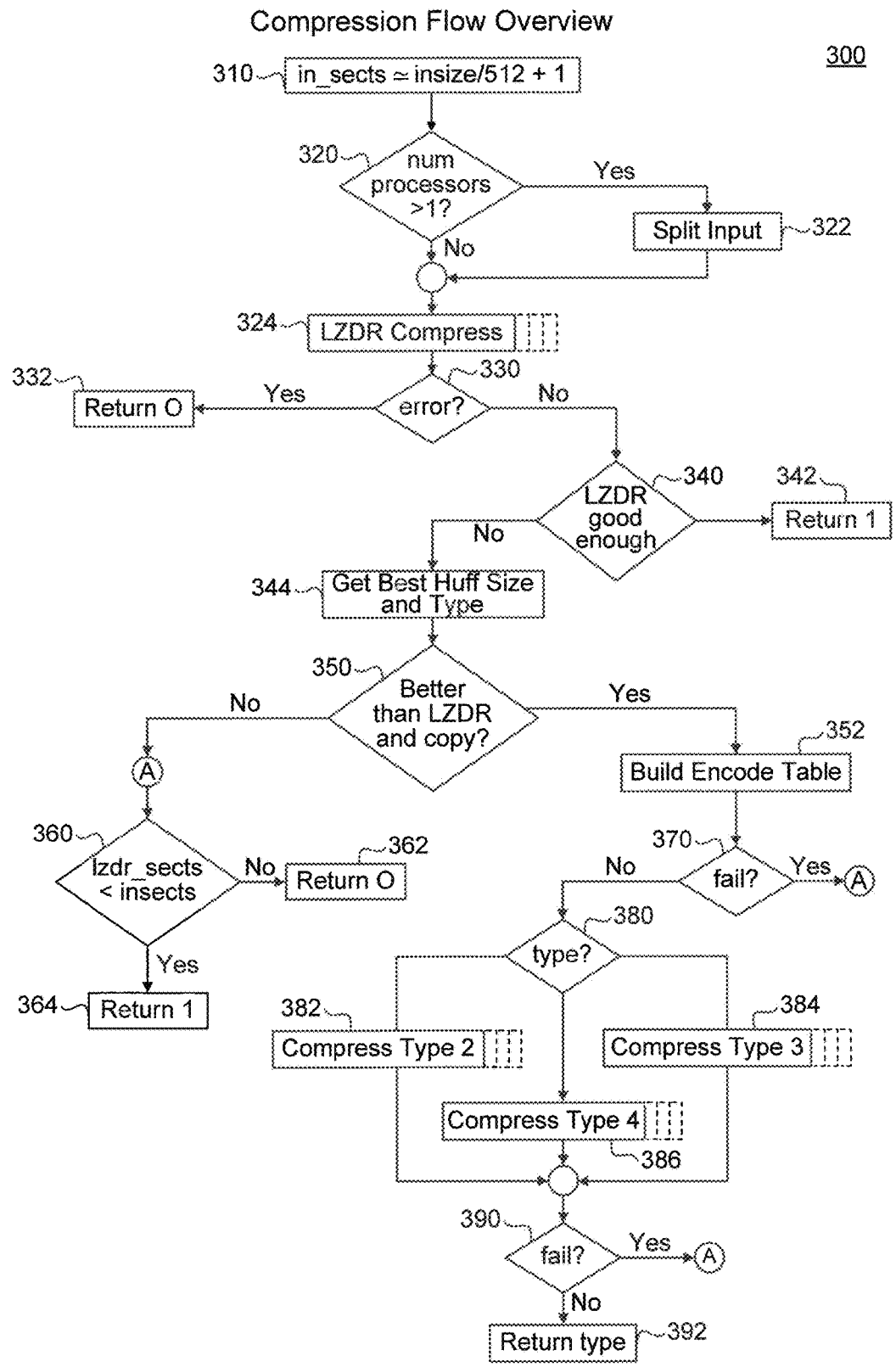
FIG. 3 is an illustration of a detailed flow diagram of content estimation data compression according to an embodiment.

FIG. 3 illustrates the flow 300 in a particular embodiment of estimation compression in an application to disk compression. In the first step, LZDR compression routine applies a combination of run length and dictionary encoding to compress the input (step 324) and simultaneously compiles statistics on the block. LZDR compression can be, for example, compression techniques associated with Lempel-Ziv (LZ), version D, with run-length encoding or LZ77 with run length encoding. An error check is performed in step 330. If an error exists, then a '0' is returned in step 332. Otherwise, method 300 transitions to a good enough step 340.

If the resulting compression is good enough, method 300 stops and uses LZDR compression (step 340). Otherwise, method 300 uses the statistics from LZDR to determine the best of the various Huffman coding methods (step 344). If none of the methods is better than LZDR (step 350), method 300 uses the best of LZDR and direct copy (step 360). If one of the Huffman methods is better, method 300 builds the corresponding compression table (step 352) and compress by the corresponding method (steps 382, 384 or 386). In step 370, a fail check is performed. If there is not a fail, then a type check is performed in step 380 prior to compression steps 382, 386, and 384. Another fail check is performed in step 390 and, if this step does not produce a fail, then the type is returned in step 392.

If multiple processors are available (step 320), the input is split into sub-blocks (step 322) and the compression methods are applied to the sub-blocks in parallel (indicated by the dotted extra boxes in steps 324, 382, 384 and 386).

Decompression Flow Overview

Figure 4:
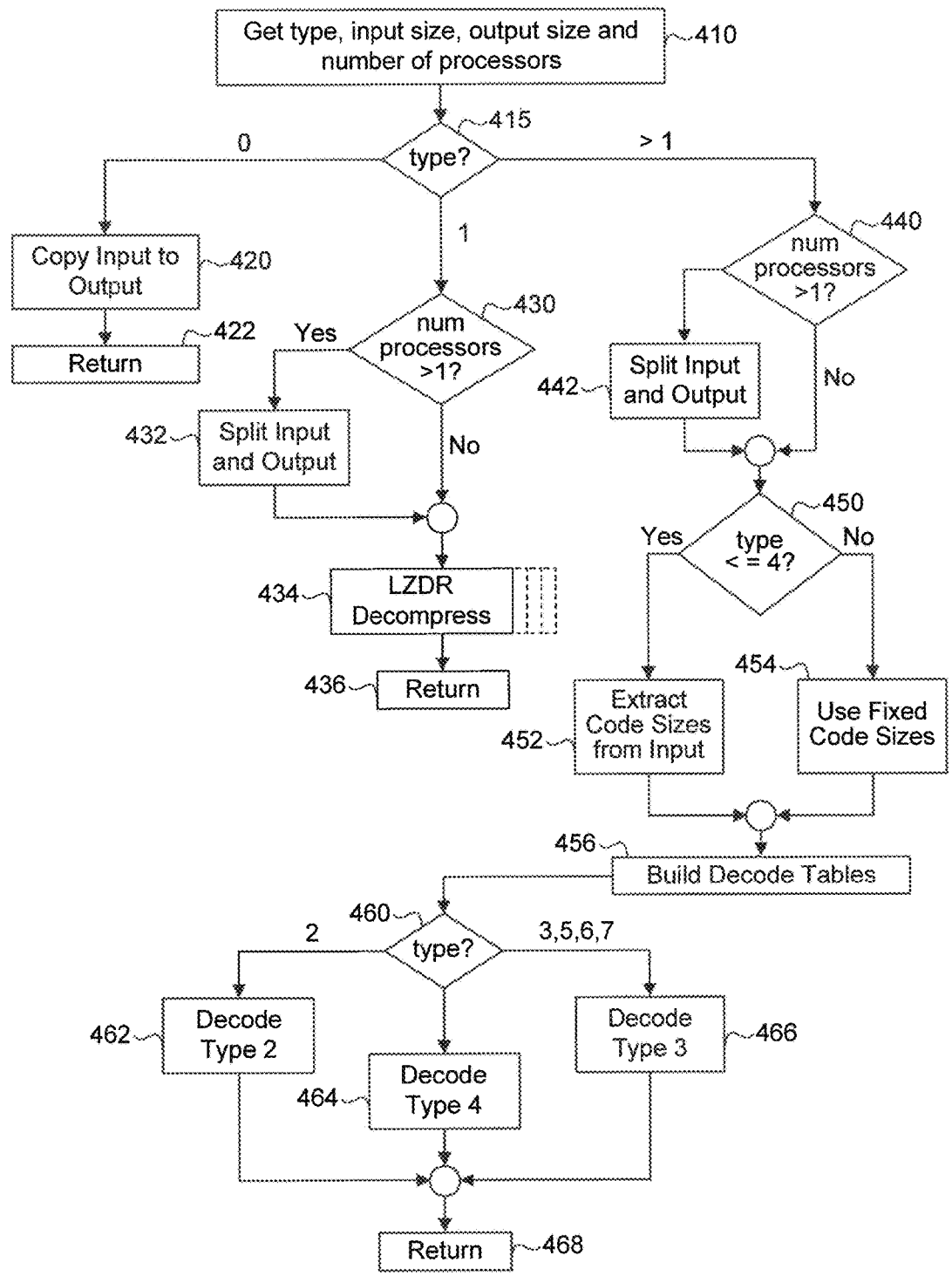
FIG. 4 is an illustration of a detailed flow diagram of content estimation data decompression according to an embodiment.

Various aspects of how the decompression dataflow occurs are illustrated in the figures, and FIG. 4 in particular. Steps to be taken during this process 400 are now discussed. These steps are presented in flowcharts, and discussed as a sequence of steps here.

The first step is to determine the compression type, number of processors used, input size and expected output size from the input parameters (see steps 410 and 415). If the type is 0 (no compression), the decompression copies the input array to the output (step 420).

For any other method, if more than one processor was used (see step 430), find where each compressed sub-block begins from the compression header and determine where each output sub-block begins by dividing the expected length into equal parts (see steps 432 and 442).

If the type is 1, apply LZDR decompression to each sub-block (in parallel if there are multiple blocks)—see step 434. If LZDR fails, return an error (see step 436).

If the type is greater than 1, method 400 first builds the decompression tables (steps 450, 452, 454, and 456). If the sub-block is one of types 2, 3 or 4 (step 450), reconstruct the Huffman decompression tables from the code size data in the compression header (steps 452 and 456). Otherwise, construct the Huffman decompression tables from the appropriate fixed code sizes (steps 454 and 456). If building the decompression tables fails, return an error.

Next, apply the appropriate Huffman decompression algorithm to each sub-block (in parallel if there are multiple blocks-see steps 462, 464, and 466). Types 3, 5, 6 and 7 use the same algorithm, just different tables (see step 466). If the Huffman decompression fails, return an error.

Compressed Block Formats

LZDR compression breaks the input block into five types of chunks and stores byte aligned representations of the chunks in order in the compressed block (followed by a termination code block). Note that in decoding, the low 2 or 3 bits of the first byte of a block determine the type.

Short run block (4-35 of the same byte in a row) encoded in two bytes as

| run_byte | run_length- 4 | 010 |
|---|---|---|
| 16 | 8 | 3   0 |

Long run block (36-8194 of the same byte in a row) encoded in three bytes as

| run_byte | long_run_length- 4 | 110 |
|---|---|---|
| 24 | 16 | 3   0 |

Short match block (3-10 bytes which exactly match a string previously seen in the source with 4<=offset<=2051 encoded in 2 bytes as

| offset-4 | match_length-3 | 01 |
|---|---|---|
| 16 | 5 | 2   0 |

Long match block (4-514 bytes which exactly match a string previously seen in the source with 4<=offset<=8192 encoded in 3 bytes as

| offset-4 | match_length-3 | 11 |
|---|---|---|
| 24 | 11 | 2   0 |

The termination code is 3 bytes of 0xff. Offset in a long match is restricted to not overlap this code.

Literal block of 1-64 bytes encoded as

| last_literal_byte | ... | literal_byte_0 | literal_length - 1 | 00 |
|---|---|---|---|---|
| | 16 | 8 | 2   0 | |

While doing the first pass LZDR also accumulates counts of

TCC[0-255] (Total_char_count. The number of times that each byte value occurs in the input);

Run_MSB_Counts[16] (Number of times each value of the MSB of run lengths occurred in the LZDR compressed block);

Match_MSB_Counts[16] (number of times each value of the MSB of match lengths occurred in the LZDR compressed block);

Literal_MSB_Counts[16] (Number of times each value of the MSB of literal run lengths occurred in the LZDR compressed block);

Offset_MSB_Counts[16] (Number of times each value of the MSB of an offset occurred in the LZDR compressed block);

Term_Counts (Number of termination codes . . . see parallel processing below);

Run_Rem_Bits (Total count of remaining bits in run length coding);

Offset_Rem_Bits (Total count of remaining bits in offset coding);

Match_Rem_Bits (Total count of remaining bits in match length coding);

Literal_Rem_Bits (Total count of remaining bits in literal run length coding);

RCC[0-255] (Run char_count. The number of times that each byte value appears in a run, except the first time in each run . . . for type 2); and, LZDR_char_count[0-255] (The number of times that each byte appears in either a run code or a literal block . . . for type 3, 4, 5, 6, 7).

The following sections describe each of the Huffman compression methods and show how the compressed size is computed from the statistics accumulated by LZDR.

Type 2

Type 2 uses a single Huffman table with 271 codes. These codes include: 256 literal byte codes (codes 0-255), 14 run length MSBit codes (for MSBit values 0-13) (codes 256-269), and 1 termination code (code 270). Type 2 scans through both the LZDR compressed block and the original uncompressed block. Literal bytes or bytes in matched strings are encoded with the corresponding literal byte code. Runs are encoded as: run length MSBit code, run length remaining bits, run char literal byte code. The block ends with a termination code followed by at least 16 high bits.

If code_bits[j] is the bit length of the Huffman code for code j, the length in bits of the compressed block can be computed as:

$$\text{SUM}[j=0..255](\text{TCC}[j]-\text{RCC}[j])*(\text{code\_bits}[j])+\text{SUM} \\ [j=0 \ldots 13](\text{Run\_MSB\_Counts}[j]*\text{code\_bits} \\ [256+j])+\text{Term\_Counts}*\text{code\_bits}[260]+\text{Run\_} \\ \text{Rem\_Bits}+16+136 \text{ bytes to store code sizes for} \\ \text{the dynamic literal byte and the run MSBit} \\ \text{table.}$$

Type 3, 5, 6, 7

Types 3, 5, 6, 7 use a literal character Huffman table of 256 codes (fixed for types 5, 6, 7 and dynamic for type 3), a separate fixed table for offset MSBit codes (MSBits 0-13), a separate fixed table of MSBit codes and termination codes, 14 Literal run length MSBit codes (codes (0-13), 10 Match length MSBit codes (codes 14-23), 14 run length MSBit codes (codes 24-37), and 1 Termination code (code 38). Types 3, 5, 6, 7 scan through the output of LZDR encoding:

Runs as run length MSBit code, run length remaining bits, run char literal byte code;

Matches as match length MSBit code, match length remaining bits, offset MSBit code, offset remaining bits; and Literal runs as literal run length MSBit code, literal run length remaining bits followed by the literal byte code for each byte in the literal run.

The block ends with a termination code followed by at least 16 high bits. Note that when decompressing, embodiments start with the length table and then based on which code is found from that table, it is known whether to use the offset table (after a match length code) or the literal character table (for runs or literal strings). If lit_bits[j] is the bit length of the Huffman code for literal character j, offset_bits[j] is the bit length of the Huffman code for offset MSBit j and length_bits [j] is the bit length for the Huffman codes in the combined length MSBit table, the length in bits of the compressed block can be computed as:

$$\text{SUM}[j=0..255](\text{LZDR\_char\_count}[j]*(\text{lit\_bits}[j])+ \\ \text{SUM}[j=0..13](\text{Offset\_MSB\_Counts}[j]*\text{offset\_} \\ \text{bits}[j])+\text{SUM}[=0.13](\text{Literal\_MSB\_Counts}[j] \\ *\text{length\_bits}[j])+\text{SUM}[j=0..9](\text{Match\_MSB\_} \\ \text{Counts}[j]*\text{length\_bits}[j+14])+\text{SUM}[=0.13] \\ (\text{Run\_MSB\_Counts}[j]*\text{length\_bits}[j+24])+ \\ \text{Term\_Counts}*\text{length\_bits}[38]+\text{Run\_Rem\_Bits}+ \\ \text{Match\_Rem\_Bits}+\text{Literal\_Rem\_Bits}+ \\ \text{Offset\_Rem\_Bits}+16$$

For type 3, embodiments add 128 bytes to store the bit counts for the dynamic literal byte table.

Type 4

Type 4 uses a separate fixed table for offset MSBit codes (MSBits 0-13), a separate table of literal bytes, MSBit codes and termination codes, 256 Literal byte codes (codes (0-255), 10 Match length MSBit codes (codes 256-265), 14 run length MSBit codes (codes 266-279), and 1 Termination code (code 280)).

Type 4 scans through the output of LZDR encoding:

Runs as run length MSBit code, run length remaining bits, run char literal byte code;

Matches as match length MSBit code, match length remaining bits, offset MSBit code, offset remaining bits; and Literal runs as the sequence of a literal byte code for each byte in the literal run.

The block ends with a termination code followed by at least 16 high bits.

Note that when decompressing, embodiments start with the literal byte/length table and then based on which code embodiments find from that table embodiments know whether to use the offset table (after a match length code) or continue with the literal/length table.

If code_bits[j] is the bit length of the Huffman code for literal/length code j and offset_bits[j] is the bit length of the Huffman code for offset MSBit j, the length in bits of the compressed block can be computed as:

$$\text{SUM}[j=0 \ldots 255](\text{LZDR\_char\_count}[j]*(\text{code\_bits} \\ [j])+\text{SUM}[j=0 \ldots 13](\text{Offset\_MSB\_Counts}[j] \\ *\text{offset\_bits}[j])+\text{SUM}[j=0 \ldots 9](\text{Match\_MSB\_} \\ \text{Counts}[j]*\text{code\_bits}[j+256])+\text{SUM}[j=0 \ldots 13] \\ (\text{Run\_MSB\_Counts}[j]*\text{code\_bits}[j+266])+ \\ \text{Term\_Counts}*\text{code\_bits}[280]+\text{Run\_Rem\_Bits}+ \\ \text{Match\_Rem\_Bits}+\text{Offset\_Rem\_Bits}+16+142 \\ \text{bytes to store the bit counts for the dynamic} \\ \text{table.}$$

To determine the best compression method, embodiments find the number of sectors required to store the uncompressed block (one plus the number of sectors in the uncompressed block to leave room for the storage block header) and the number of sectors required to store the output of LZDR (including the storage block header). Then embodiments use the statistics from LZDR as described above to find the number of bits and thus the number of sectors output for each of the Huffman methods. Embodiments choose the method that requires the least number of sectors with ties resolved by

0>1>4>2>5>6>7>3.

As previously stated, it is to be understood that the system processes the input data stream in data blocks that may range in size from individual bits through complete files or collections of multiple files. Additionally, the data block size may be fixed or variable. The choice of using disk sectors as a quantity of data is one convenient metric for the above stated embodiment and is in no way intended to limit the present disclosure to the use of disk sectors.

Algorithm Details

ExtractBits(val, shift, bitcnt) returns the value obtained by first shifting val right shift bits, and then taking the low bitcnt bits of the result.

Huffman Encoding Details

Each Huffman encoding table has one 32 bit entry for each code in the form:

| code size | Huffman code |
|---|---|
| 32 | 26 0 |

All Huffman compressed blocks are written out as sequences of 16 bit words. The processing maintains a 32-bit shift register sreg, a count of the number of valid bits in sreg, next_bit, and a count of the number of words output, outcnt. Initially, sreg, next_bit and outcnt are 0.

Building Blocks

The Following 4 Routines are Used in the Description of Huffman Compression of LZDR Output Below.

If there are more than 15 valid bits in sreg, embodiments write a word out.

```
Check_Need_Output:
    If (next_bit >= 16)
        Output (sreg & 0xffff)
        Shift sreg right 16 bits
        Decrement next_bit by 16
    End if
```

Send the low bitcnt bits of val to the output bit stream:

```
SendBits(val, bitcnt)
    val = ExtractBits(val, 0, bitcnt)
    sreg = sreg OR LEFTSHIFT(val, next_bit)
    next_bit = next_bit + bitcnt
    Check_Need_Output
```

Send the Huffman bits corresponding to code from table T:

```
SendCode(T, code)
    table_entry = T[code]
    size = ExtractBits(table_entry, 26, 6)
    val = ExtractBits(table_entry, 0, 26)
    SendBits(val, size)
```

Next, embodiments encode a non-negative integer as a code for the most significant bit followed by the remaining bits of the value. Type_offset is the offset in the table to the code for MSBit of 0 (corresponding to a value of 0) for a particular type (match, run or literal run). The remaining codes for that type follow sequentially. The offset table has only one type so type_offset is always 0.

```
EncodeValue(T, value, type_offset)
    msb = MSBit(value)
    SendCode(T, type_offset + msb)
    If(msb > 1)
        SendBits(value, msb-1)
```

Processing LZDR Compressed Blocks

Figure 5:
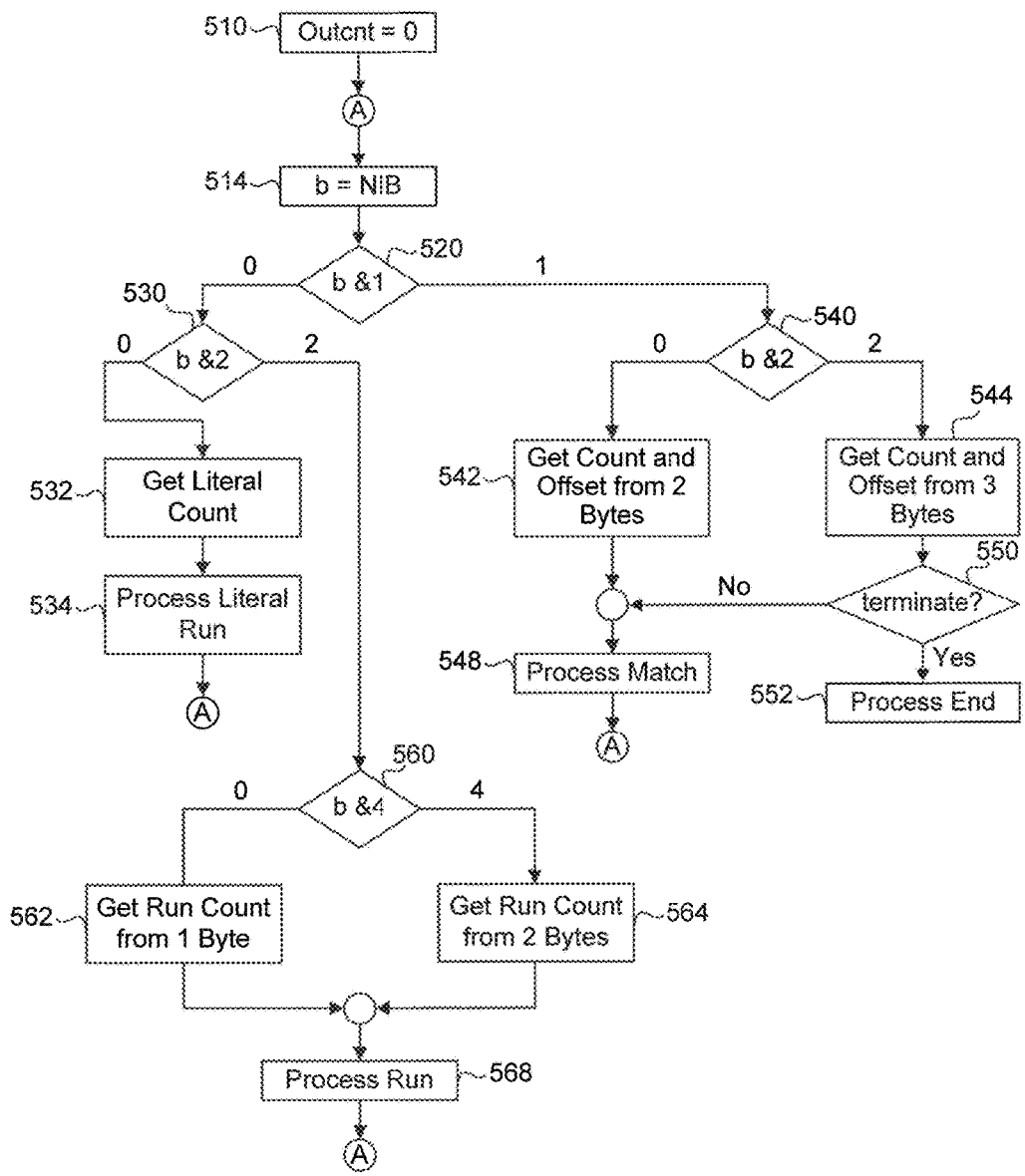
FIG. 5 is an illustration of a detailed flow diagram of processing LZDR according to an embodiment.

Since each LZDR sub-block type is determined by the low bits of the first byte of the block, decompression is essentially a switch-case construct with code to produce output based on the sub-block type (figures, and FIG. 5 in particular, present flowcharts of how processing LZDR and block descriptions occurs).

The same flow is used in decompressing LZDR compressed blocks and applying Huffman compression to the output of LZDR compression. This flow 500 of FIG. 5 includes: initial steps 510, 512, and 514; decision logic 520, 530, 540, 546, and 560; get data steps 532, 542, 544, 562, and 564; and, terminate check 550. As shown in FIG. 5, these steps control processing of Process Literal Run 534, Process Run 568, Process Match 548, and Process End 552.

LZDR Decompression (outcnt is the number of bytes output so far, initially 0.)

```
Process Literal Run (step 534):
    Copy literal_count bytes from input to output
    outcnt = outcnt + literal_count
Process Run (step 568):
    Write run_byte to the output run_count times
    outcnt = outcnt + run_count
Process Match (step 548):
    Copy match_count bytes starting at (outcnt - offset) in the
    output to the output
    outcnt = outcnt + match_count
Process End (step 552):
    Return outcnt
```

Huffman Compression of LZDR Output

In this case embodiments have 3 tables:
1. B(ase), which contains MSBit codes for match, run and literal run and the terminate code
2. C(haracter), which contains 256 byte codes with the code for the byte value being the byte value
3. O(ffset), which contains MSBit codes for offsets.

In types 2 and 4, tables B and C are combined with B following C.

The processing for different Huffman types may be different.

```
Process Literal Run (step 534):
    Type 2 and 4:
        For literal_count input bytes b, SendCode(C, b)
    Types 3, 5, 6, 7:
        EncodeValue(B, literal_count - 1, literal_offset)
        For literal_count input bytes b, SendCode(C, b)
Process Run (step 568)
    EncodeValue(B, run_count - 4, run_offset)
    SendCode(C, run_byte)
Process Match:        (not used in type 2–step 548)
    EncodeValue(B, match_count - 3, match_offset)
    EncodeValue(O, offset - 4, 0)
Process End (step 552):
    SendCode(B, terminate)
    If (next_bit > 0) SendBits(0xffff, 16)    // flush any valid bits
    Output(0xffff)                 // add at least 32 1 bits at the end
    Output(0xffff)
    outcnt = outcnt + 2
    Return 2*outcnt
```

Huffman Decoding Details

Figure 6:
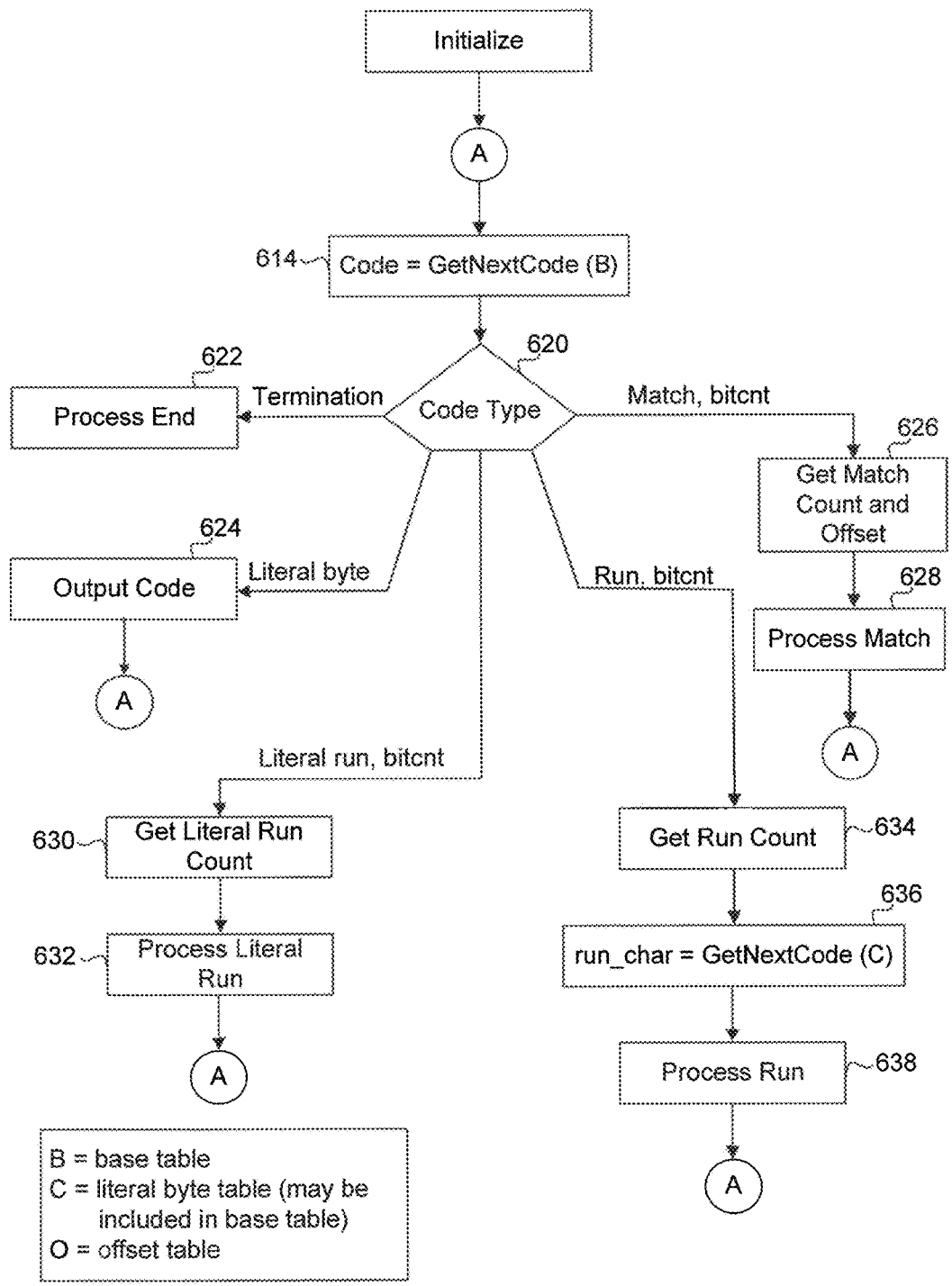
FIG. 6 is an illustration of a detailed flow diagram of Huffman decompression according to an embodiment.

FIG. 6 illustrates a Huffman decompression flowchart 600. Decode processing maintains a 32-bit shift register sreg, a count of the number of valid bits in sreg, cur_bits, and a count of the number of bytes output, outcnt. Initially, sreg is loaded with the first 2 words of the input, cur_bits is 32 and outcnt is 0.

In an embodiment, each Huffman decoding table is several tables of 256 entries of the form:

```
| forward flag | step size | value |
  16           15          9       0
```

Step size is the amount to shift sreg after processing. If forward flag is 0, value is the code to output, otherwise, value indexes a second table which is used to find the final value. In use, the base sub-table, sub_table 0, is indexed by the low 8 bits of sreg. Step size bits of sreg are shifted out. If forward flag is zero, return value, otherwise, index sub_table(value) with the low 8 bits of sreg, shift out step size bits and return value. It may be noted that more than one forwarding is not required, according to an embodiment. Building blocks: The following routines are used in the description of the Huffman decompression flow chart (FIG. 6).
If there are not 16 bits in the shift register, get another 16 from the input

```
CheckNeedInput:
    If (cur_bits < 16)
        in_word = next_input_word
        sreg = sreg OR LEFTSHIFT(in_word, cur_bits)
        cur_bits = cur_bits + 16
    End if
Get the value and forward flag corresponding the current input stream
from table T using the sub table index
Get_Base_Code(T, sub_table_index)
    index = sreg & 0xff
    table_ent = T(index, sub_table_index)
    size = ExtractBits(table_ent, 9, 6)
    value = ExtractBits(table_ent, 0, 9)
    forward = ExtractBits(table_ent, 16, 1)
    sreg = RIGHTSHIFT(sreg, size)
    cur_bits = cur_bits - size
    CheckNeedInput
Get the next code from the input using table T
GetNextCode(T) (steps 614, 636, and blocks below)
    GetBaseCode(T, 0)
    If(forward == 0) return value
    Else
        Sub_index = value
        GetBaseCode(T, sub_index)
        Return value
    End if
Get the next bitcnt bits from the input stream:
GetBits(bitcnt)
    value = ExtractBits(sreg, 0, bitcnt)
    sreg = RIGHTSHIFT(sreg, bitcnt)
    cur_bits = cur_bits - bitcnt
    CheckNeedInput
Blocks in diagram Huffman Decompression Flow:
BITVAL(bitcnt) is 0 if bitcnt is 0, otherwise 1 shifted left (bitcnt −1)
places
At the code type decision point (step 620), embodiments will have one of:
Terminate
Literal Byte (types 2 and 4 only)
Literal Run + MSBit of the literal run count
Run + MSBit of the run count
Match + MSBit of the match count
Process End (step 622):
    Return outcnt
```

Embodiments have MSBit, get the rest of the bits if any and tack them on
Get Literal Run Count (step 630):
```
    If bitcnt > 1,
        literal_count = (GetBits(bitcnt −1) OR BITVAL(bitcnt)) + 1
        Else literal_count = BITVAL(bitcnt) + 1
Get literal_count bytes from input and write to output
```

-continued

```
Process Literal Run (step 632):
    Repeat literal_count times
        Code = GetNextCode( C )
        Output code
    End repeat
    outcnt = outcnt + literal_count
Embodiments have MSBit, get the rest of the bits if any and tack them on
Get Run Count (step 634):
    If bitcnt > 1, run_count = (GetBits(bitcnt −1) OR
    BITVAL(bitcnt)) + 4
    Else run_count = BITVAL(bitcnt) + 4
Process Run (step 638):
    Write run_char run_count times to the output
    outcnt = outcnt + run_count
Embodiments have MSBit of match_count, get the rest of the bits if
any and tack them on
Then get MSBit of offset and get the extra bits
Get Match Count and Offset (step 626)
    If bitcnt > 1, match_count = (GetBits(bitcnt −1) OR
    BITVAL(bitcnt)) + 3
    Else match_count = BITVAL(bitcnt) + 3
    bitcnt = GetNextCode(O)
    If bitcnt > 1, offset = (GetBits(bitcnt −1) OR BITVAL(bitcnt)) + 4
    Else offset = BITVAL(bitcnt) + 4
Process Match (step 628):
    Copy match_count bytes from (outcnt − offset) in the output stream
    to the output
    outcnt = outcnt + match_count
Output code (step 624):
    Write code to output
    outcnt = outcnt + 1
```

LZDR Compression

Figure 7:
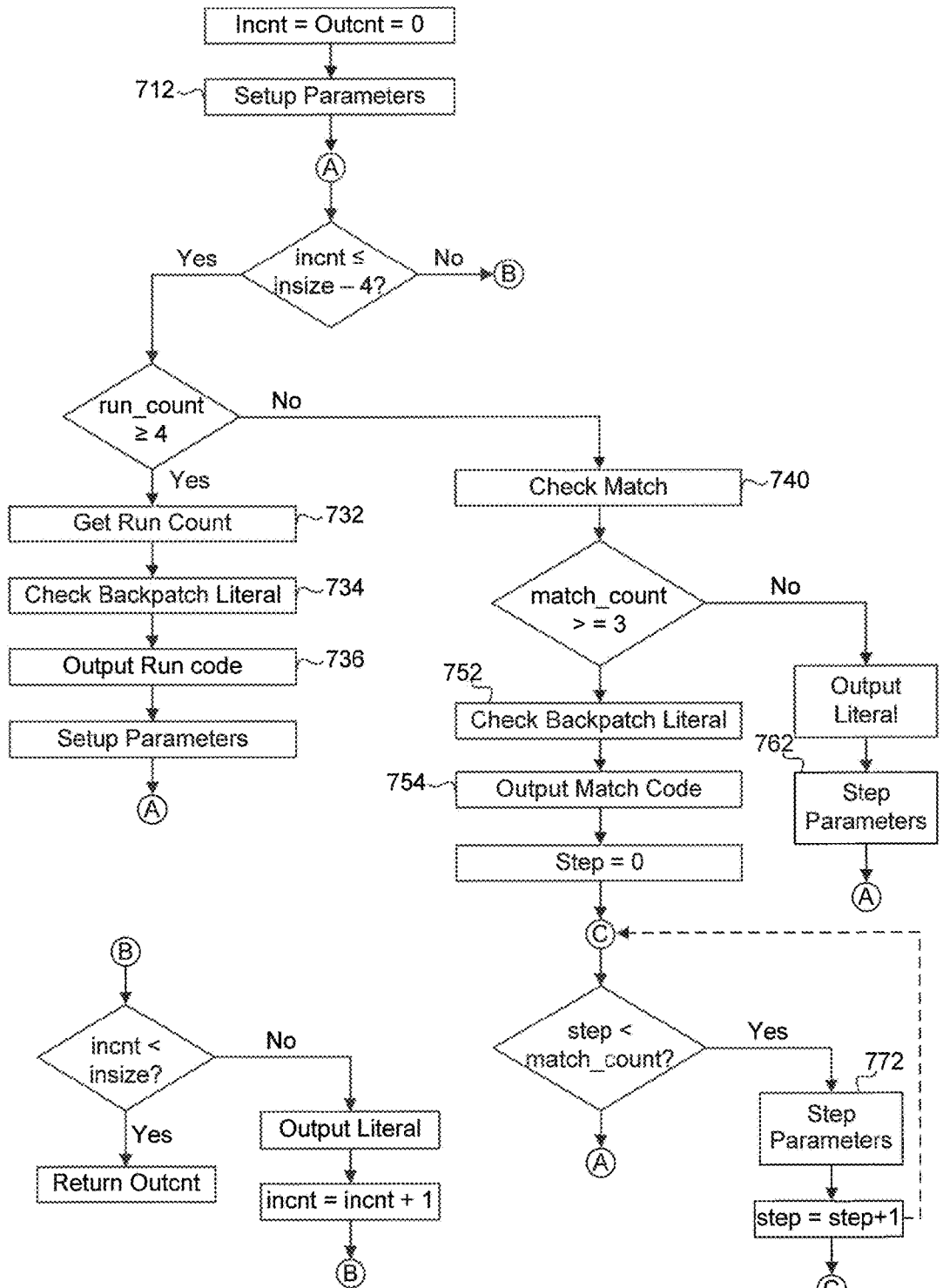
FIG. 7 is an illustration of a detailed flow diagram of LZDR Compression according to an embodiment.

The way in which LZDR compression flow operates is illustrated in flowchart 700 of FIG. 7. Compression runs with the following parameters. The number of input bytes processed so far is incnt. This value is also the location of the next byte to be processed in the input buffer. The number of bytes output so far is outcnt. The next 4 bytes in the input stream will be b0=inbuf[incnt], b1, b2 and b3. Run detection is handled by maintaining a last_run_byte and a run_count of the number of successive times last_run_byte occurred prior to and including inbuf[incnt+3].

Literal blocks are handled by skipping one byte in the output for the header before outputting literal run characters. When a literal run ends (because the length got to 64 or a run or match is to be output) the literal count is written to the reserved location. To handle this, the value lit_start is used, which is the index at which to back patch the length code and the value lit_cnt, which is the number of literal bytes written so far in this block.

For match detection, a comparison double word, cmpwd is maintained:

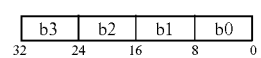

containing the next 4 bytes from the input stream and a value, hash_index,

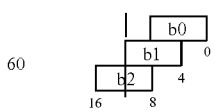

composed by XORing shifted versions of the next 3 bytes from the input stream. Only the low 12 bits of hash_index are used to access the dictionary (indicated by the dashed vertical line).

The Match Dictionary

The match dictionary is a hash table with 4096 buckets. Each of the buckets contains 4 hash entries. Each hash entry has a 16 bit location in the input where the match starts and a 32 bit start_word formed from the next 4 bytes starting from the input location as for cmpwd above.

Each hash table bucket also has an 8-bit counter that indicates how many buckets in the entry are populated and which bucket is least recently filled and can be replaced with a new bucket entry. If the counter is <=3, it gives the number of used buckets and the next bucket to be used. If the counter is >=4, all four buckets are used and the next bucket to be replaced is (counter & 3).

Since the index into the hash table depends only on the next 3 bytes of input, the dictionary can be used to look for matches of three or more bytes. It is possible to test for a match of at least four bytes at a location by comparing start_word with cmpwd. It is also possible to test for a match of 3 bytes at a location by comparing start_word AND 0xffffff with cmpwd AND 0xffffff.

The overall flow of LZDR compression is shown in FIG. 7. The sub-blocks are described below. For the LZDR compression flow, description of how to check matches is illustrated in FIGS. 8-11.

```
Setup Parameters (step 712):
last_run_byte = b0 = inbuf[incnt]
run_count = 1
cmpwd = hash_index = b0
b1 = inbuf[incnt+1]
cmpwd = cmpwd OR LEFTSHIFT(b1, 8)
hash_ind = hash_ind XOR LEFTSHIFT(b1, 4)
if(b1 == last_run_byte)
    run_count = run_count + 1
else
    last_run_byte = b1
    run_count = 1
end if
b2 = inbuf[incnt+2]
cmpwd = cmpwd OR LEFTSHIFT(b2,16)
hash_ind = hash_ind XOR LEFTSHIFT(b2,8)
if(b2 == last_run_byte)
    run_count = run_count + 1
else
    last_run_byte = b2
    run_count = 1
end if
b3 = inbuf[incnt+3]
cmpwd = cmpwd OR LEFTSHIFT(b3, 24)
if(b3 == last_run_byte)
    run_count = run_count + 1
else
    last_run_byte = b3
    run_count = 1
end if
Step Parameters (steps 762 and 772)
// add current sting to dictionary
bucket = hash_ind AND 0xfff
index = counter[bucket] & 3
location[bucket, index] = incnt
start_word[bucket, index] = cmpwd
counter[bucket] = counter[bucket] + 1
if(counter[bucket] >= 8)
    counter[bucket] = counter[bucket] - 4
endif
// update cmpwd and hash_index
b0 = inbuf[incnt]
cmpwd = RIGHTSHIFT(cmpwd , 8)
hash_ind = hash_ind XOR b0
hash_ind = RIGHTSHIFT(hash_ind, 4)
incnt = incnt+1
b2 = inbuf[incnt + 2]
hash_ind = hash_ind XOR LEFTSHIFT(b2, 8)
b3 = inbuf[incnt + 3]
cmpwd = cmpwd OR LEFTSHIFT(b3, 24)
```

-continued

Figure 8:
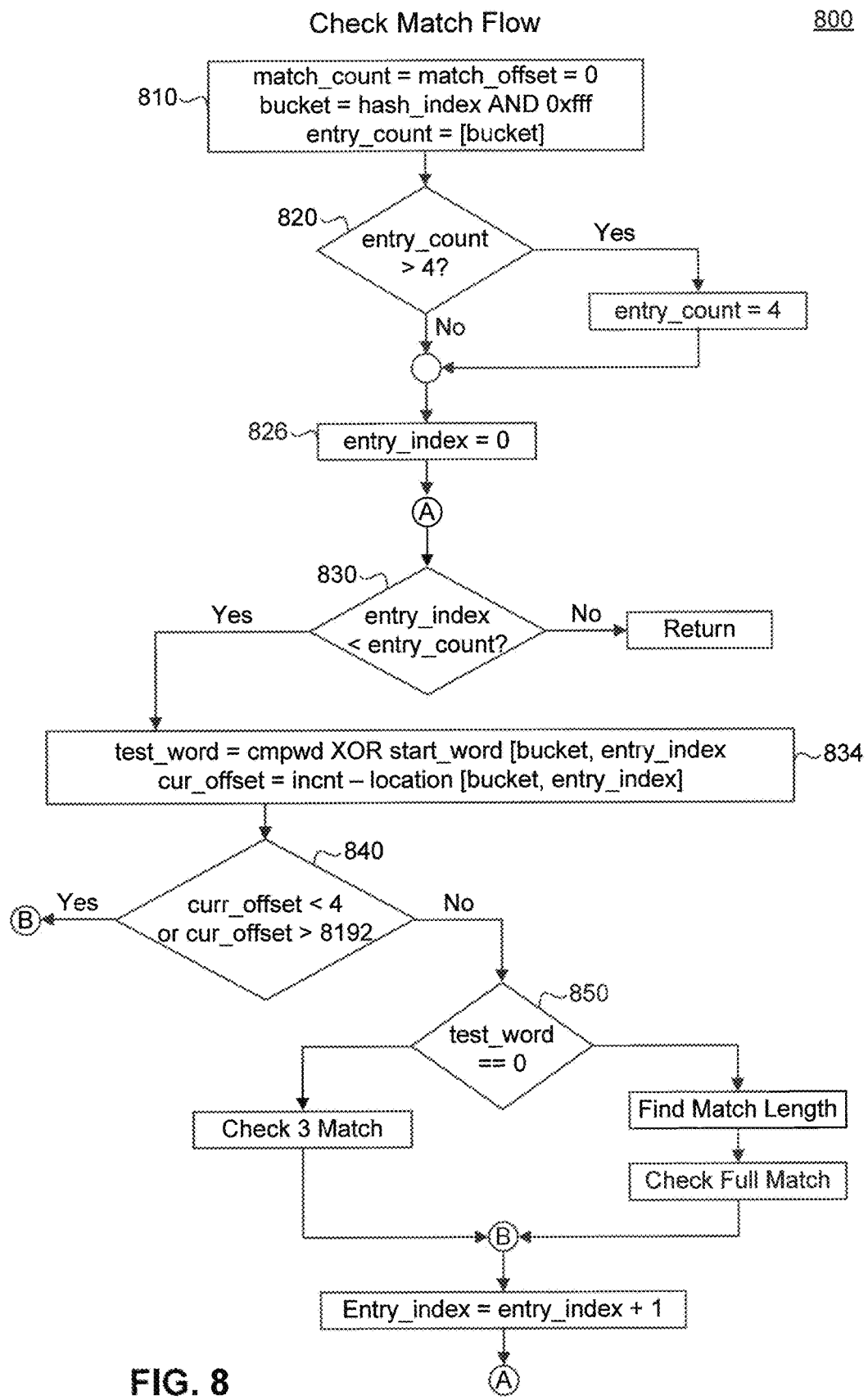
FIG. 8 is an illustration of a detailed flow diagram of LZDR compression checking for a match according to an embodiment.
Figure 9:
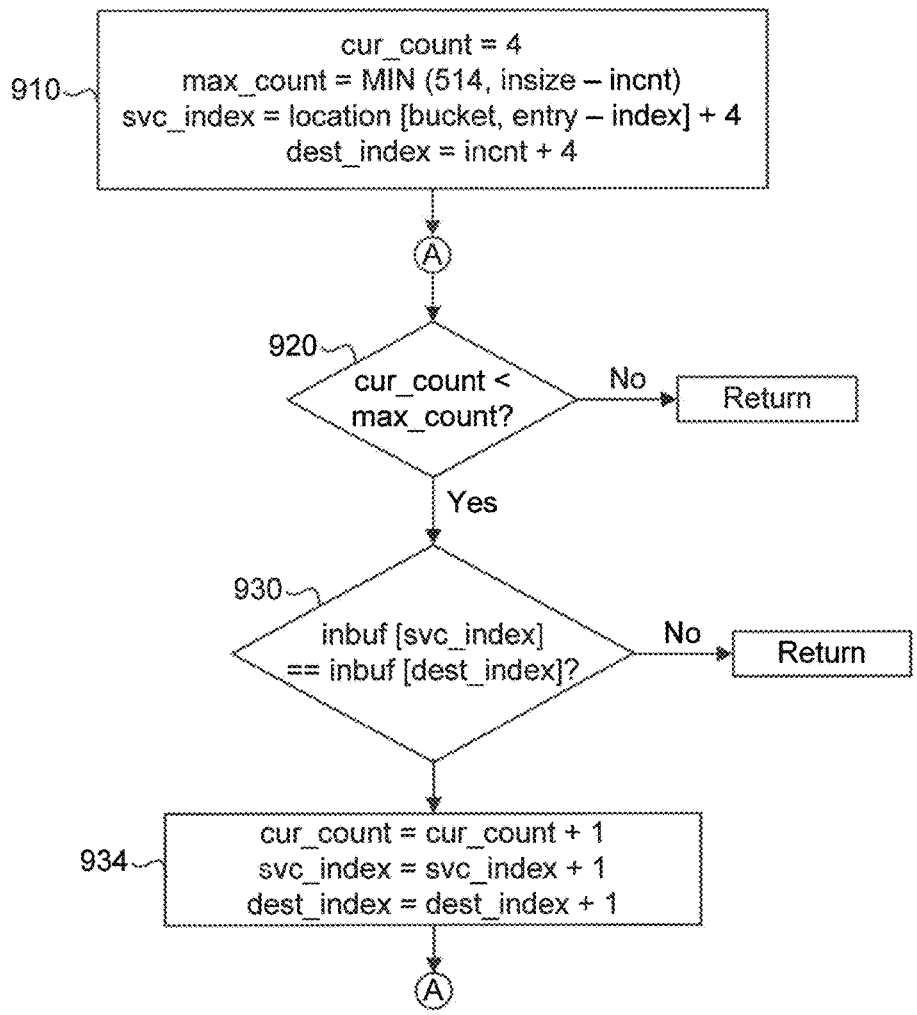
FIG. 9 is an illustration of a detailed flow diagram of LZDR compression finding the match length according to an embodiment.
Figure 10:
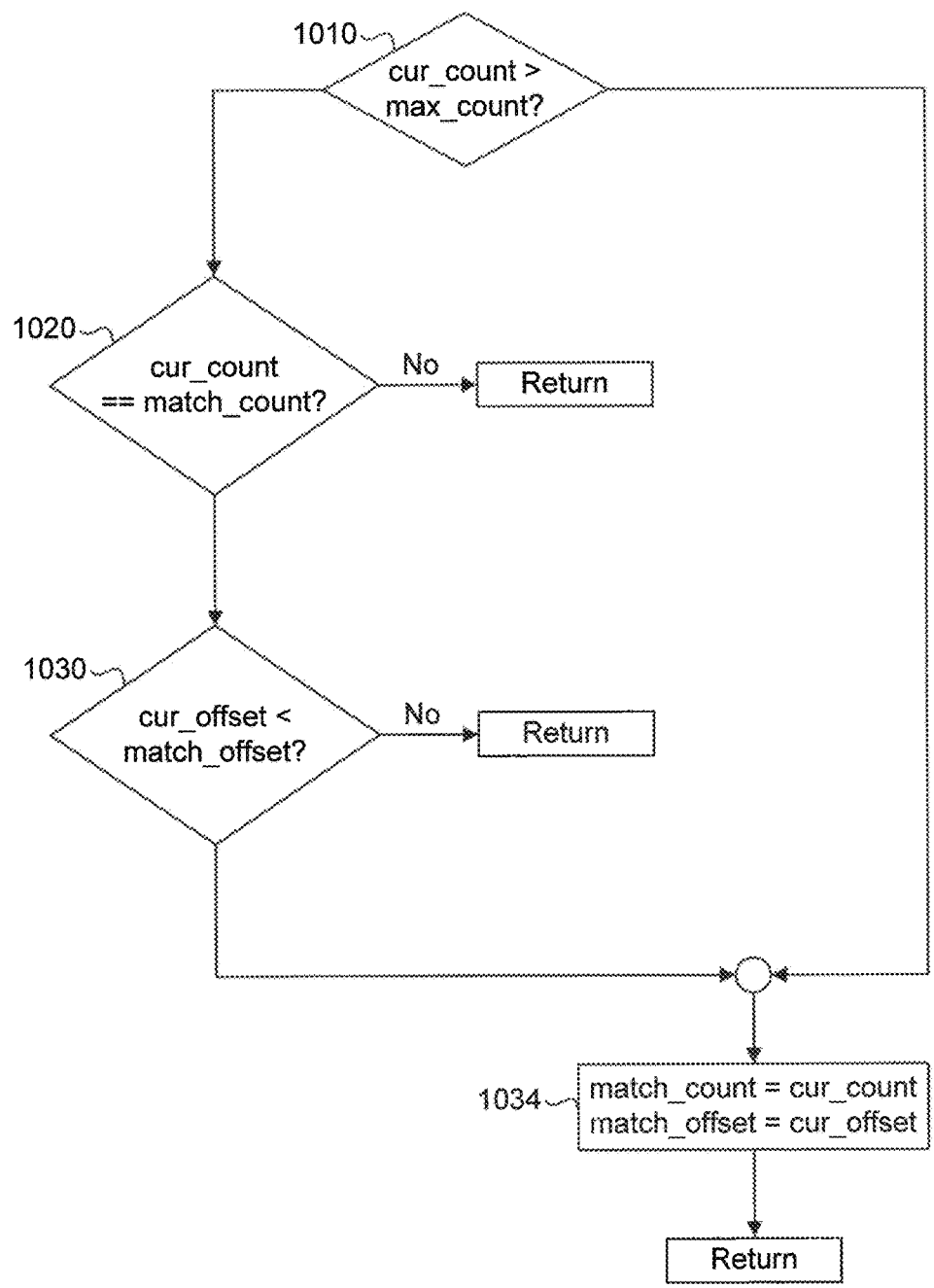
FIG. 10 is an illustration of a detailed flow diagram of LZDR compression checking if a full match is better than a previous match according to an embodiment.
Figure 11:
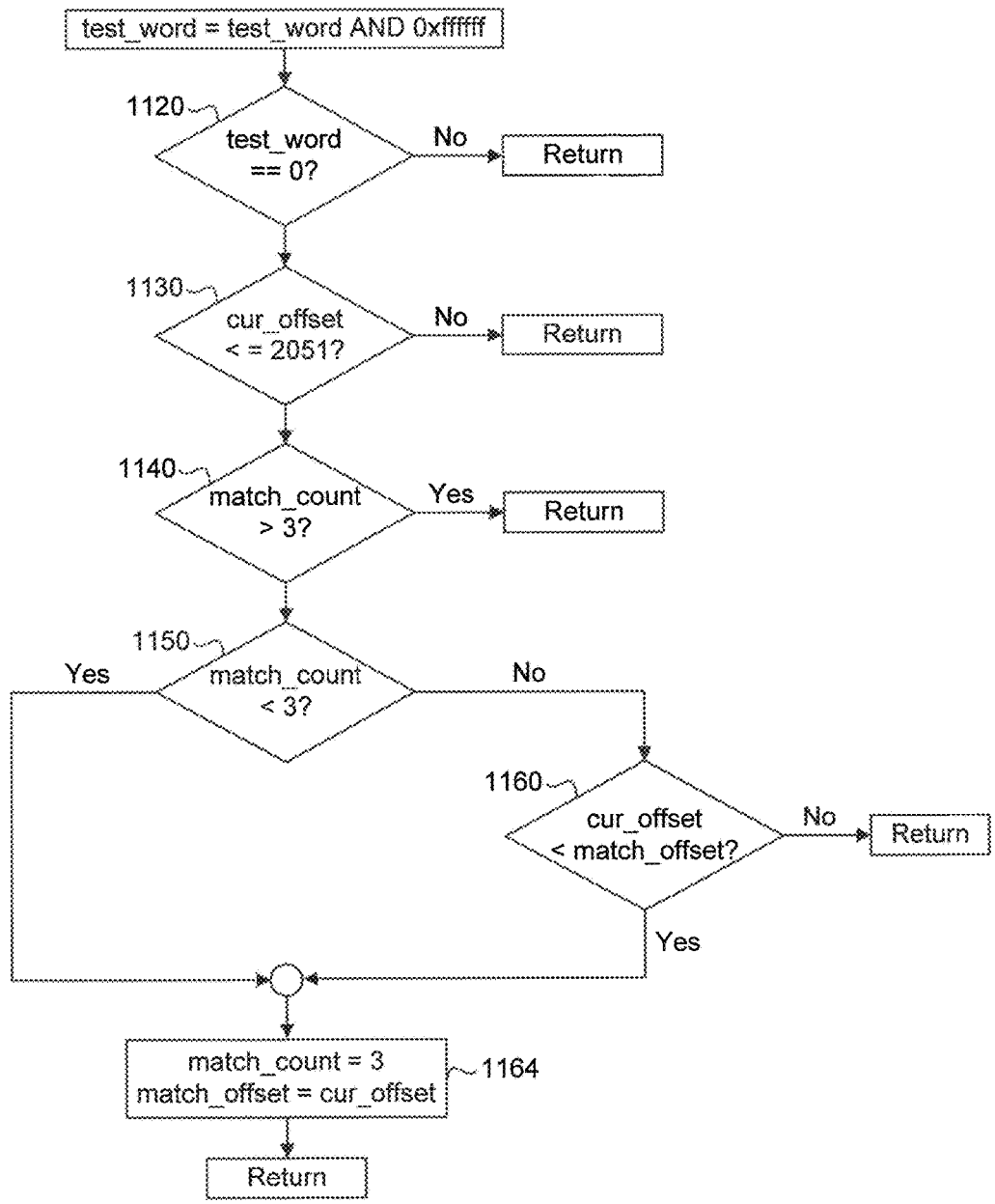
FIG. 11 is an illustration of a detailed flow diagram of LZDR compression checking if a three byte match is better than any previous match according to an embodiment.

```
// check run
if(last_run_byte == b3)
    run_count = run_count + 1
else
    last_run_byte = b3
    run_count = 1
end if
Check Backpatch Literal (steps 734 and 752)
if(lit_count > 0)
outbuf[lit_start] = lit_count
lit_count = 0
end if
Output Literal
if(lit_count == 0)
    lit_start = outcnt
    outcnt = outcnt + 1
end if
outbuf[outcnt] = inbuf[incnt]
outcnt = outcnt+1
lit_count = lit_count + 1
if(lit_count == 64)
outbuf[lit_start] = lit_count
lit_count = 0
end if
Get Run Count (step 732)
max_count = MIN(8194, insize – incnt)
// do not run off the end of input
index = incnt + 4      // next index not yet checked
while((run_count < max_count) LOG_AND
(inbuf[index] == last_run_byte))
run_count = run_count + 1
index = index + 1
end while
Output Run Code (step 736)
if(run_count <= 35)
    outbuf[outcnt] = LEFTSHIFT(run_count – 4), 3) OR 2
    outcnt = outcnt + 1
    outbuf[outcnt] = last_run_byte
    outcnt = outcnt + 1
else
val = LEFTSHIFT(run_count – 4, 3) OR 6
outbuf[outcnt] = val AND 0xff
outcnt = outcnt + 1
outbuf[outcnt] = RIGHTSHIFT(val, 8) AND 0xff
outcnt = outcnt + 1
outbuf[outcnt] = last_run_byte
outcnt = outcnt + 1
end if
Check Match (step 740; see also Figure 8: Check Match Flow 800,
Figure 9: Find Match Length 900, Figure 10: Check Full Match 1000, and
Figure 11: Check 3 Match 1100)
match_count = 0 (step 810)
match_offset = 0
bucket = hash_index AND 0xfff
entry_count = count[bucket]
if(entry_count > 4) (step 820)
    entry_count = 4
endif
entry_index = 0 (step 826)
while(entry_index < entry_count) (step 830)
test_word = cmpwd XOR start_word[bucket, entry_index] (step 834)
cur_offset = incnt – location[bucket, entry_index]
if((cur_offset >= 4) LOG_AND (cur_offset <= 8192)) (step 840)
if(test_word == 0)      // at least 4 byte match (step 850)
    cur_count = 4 (step 910)
    max_count = MIN(514, insize – incnt)
    src_index = location[bucket, entry_index] + 4
    dest_index = incnt + 4
    while((cur_count < max_count) LOG_AND (step 920)
        (inbuf[dest_index] == inbuf[src-index])) (step 930)
        src_index = src_index + 1 (step 934)
        dest_index = dest_index + 1
    end while
    if((cur_count > match_count) LOG_OR (step 1010)
        ((cur_count == match_count) LOG_AND (step 1020)
        (cur_offset < match_offset))) (step 1030)
        match_count = cur_count (step 1034)
        match_offset = cur_offset
    end if
```

```
else if((test_word AND 0xffffff) == 0)    // 3 byte match (step 1120)
    if(cur_offset <= 2051)       // only use 2 byte code (step 1130)
        if((match_count < 3) LOG_OR (step 1150)
            ((match_count == 3) LOG_AND (steps 1140 and 1150)
            (cur_offset < match_offset))) (step 1160)
            match_count = 3 (step 1164)
            match_offset = cur_offset
        end if
    end if
end if
end if
entry_index = entry_index + 1
end while
Output Match Code (step 754)
if((match_count <= 10) LOG_AND (match_offset <= 2051))
    val = 1 OR LEFTSHIFT(match_count - 3, 2) OR
        LEFT_SHIFT(match_offset - 4, 5)
    outbuf[outcnt] = val AND 0xff
    outcnt = outcnt + 1
    outbuf[outcnt] = RIGHTSHIFT(val, 8) AND 0xff
    outcnt = outcnt + 1
else
    val = 3 OR LEFTSHIFT(match_count - 3, 2) OR
        LEFT_SHIFT(match_offset - 4, 11)
    outbuf[outcnt] = val AND 0xff
    outcnt = outcnt + 1
    outbuf[outcnt] = RIGHTSHIFT(val, 8) AND 0xff
    outcnt = outcnt + 1
    outbuf[outcnt] = RIGHTSHIFT(val, 16) AND 0xff
    outcnt = outcnt + 1
end if
```

Determining Bit Code Lengths for Dynamic "Huffman" Tables

In this embodiment, the size of Huffman codes is stored in 4 bits, reserving 0 to indicate that the code does not appear in the block. This means that codes are limited to 15 bits. An approximate method 1200 outlined in FIG. 12 assures a maximum code size of 15 bits. Since codes are prefix codes, an n bit code precludes any other code that begins with the same bit sequence. Thus, a code of length n uses up $2^{(15-n)}$ of the 32768 code slots The method uses a heuristic to first generate a set of code sizes which overestimate the final code sizes (steps 1210 to 1250). The further heuristics are used to decrease the length of codes to use up the total code space (steps 1260 to 1272).

Figure 12:
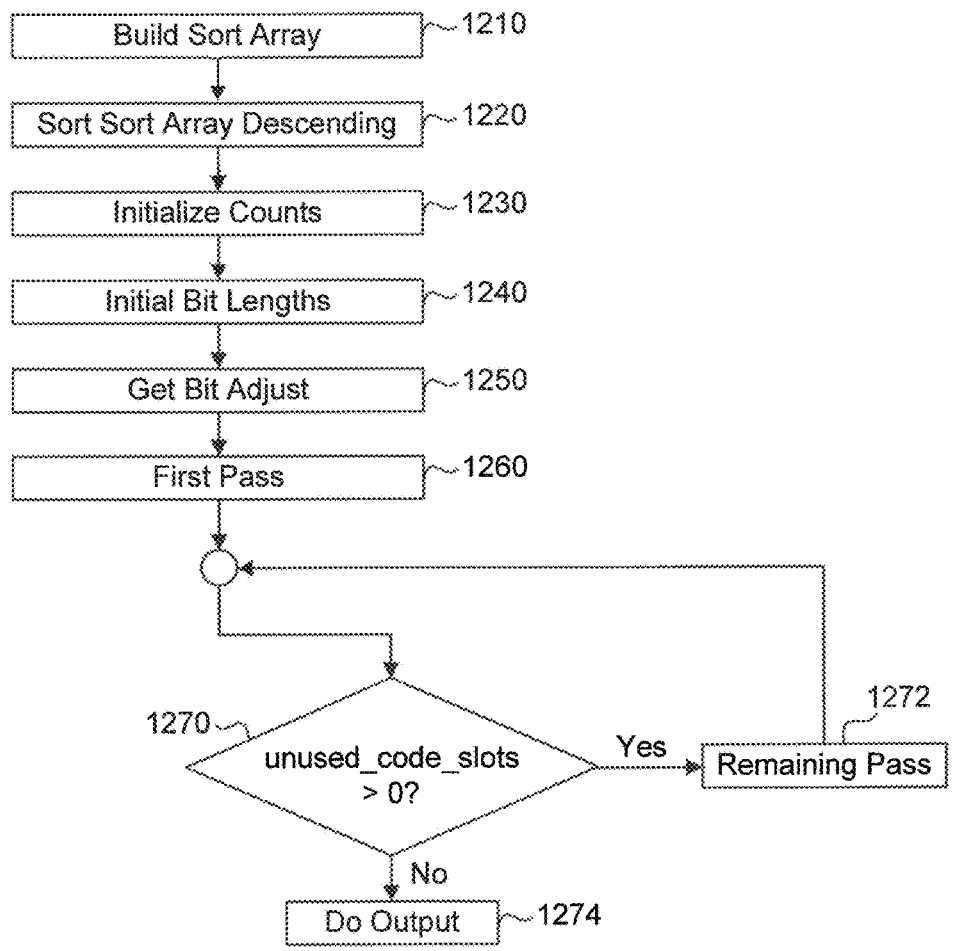
FIG. 12 is an illustration of a detailed flow diagram of assigning Huffman Code Lengths according to an embodiment.

The following gives detail of the approximate method used to assign bit code lengths (see FIG. 12). A table is built of 32 bit values with the count for the code in the high 16 bits and the code in the low 16 bits (see step 1210). The table is then sorted in decreasing order (see step 1220). For example, the sorting may occur using radix sort. Build Sort Array (see step 1210):

```
index = 0
while(index <= num_codes)
    sort_array[index] = LEFTSHIFT(counts[index], 16) OR index
end while
```

On output, outbits[index] is the bit length of code index and blcnts[index] is the number of codes with bit length index,

```
Initialize Counts (see step 1230)
    total_slots = 32768
    used_slots = 0
    for index = 0 to num_codes - 1
        outbits[index] = 0;
```

```
for index = 0 to 16
    blcnts[index] = 0
```

Initially, embodiments allocate a number of bits for a code with a non-zero count by

```
bits = min(15, 17 - MSBit(count))
(recall that MSBit(count) is 1 more than the most significant bit location
of
count) which is (almost certainly) an underestimate of the correct bit size
since the total count will be less than 65536 (unless there are no matches
or runs) so
bits = log2((2^(MSBit(count)) - 1)/65536) <= log2(count/total_count)
unless total_count is > 65536 and all counts are exact powers of 2
Initial Bit Lengths (step 1240)
nz_count = num_codes
index = 0
total_count = 0
while (index < num_codes)
    count = RIGHTSHIFT(sort_array[index], 16)   // count for this code
    if(count == 0)
        nz_count = index
        exit while
    end if
    bits[index] = MIN(15, 17 - MSBit(count))
    used_slots = used_slots + RIGHTSHIFT(total_slots, bits[index])
    total_count = total_count + count
end while
```

To illustrate, suppose embodiments have the following codes and counts:

| code | count |
|---|---|
| 0 | 130 |
| 1 | 50 |
| 2 | 80 |
| 3 | 5 |
| 4 | 7 |
| 5 | 27 |
| 6 | 9 |
| 7 | 0 |
| 8 | 15 |
| 9 | 21 |
| 10 | 3 |
| 11 | 1 |
| Total | 348 |

Sorting by count in descending order, allocating initial bits and computing code slots for that bit allocation embodiments get:

| Code | Count | bits | slots |
|---|---|---|---|
| 0 | 130 | 9 | 64 |
| 2 | 80 | 10 | 32 |
| 1 | 50 | 11 | 16 |
| 5 | 27 | 12 | 8 |
| 9 | 21 | 12 | 8 |
| 8 | 15 | 13 | 4 |
| 6 | 9 | 13 | 4 |
| 4 | 7 | 14 | 2 |
| 3 | 5 | 14 | 2 |
| 10 | 3 | 15 | 1 |
| 11 | 1 | 15 | 1 |
| 7 | 0 | 0 | 0 |
| Total | 348 | total | 142 |

In the next step for this embodiment, the bit lengths of all codes (and thus double the code space used) are repeatedly decreased until the total code space used is between 16384 and 32768.

```
Get Bit Adjust (step 1250)
bit_adjust = 0
while(used_slots <= 16384)
    bit_adjust = bit_adjust + 1
    used_slots = used_slots * 2
end while
```

In the example it takes 7 factors of 2 to get to the correct range:

142->284->568->1136->2272->4544->9088->18176 so embodiments subtract 7 from each non-zero bit count and multiply slots by 128

| Code | Count | bits | slots |
|---|---|---|---|
| 0 | 130 | 2 | 8192 |
| 2 | 80 | 3 | 4096 |
| 1 | 50 | 4 | 2048 |
| 5 | 27 | 5 | 1024 |
| 9 | 21 | 5 | 1024 |
| 8 | 15 | 6 | 512 |
| 6 | 9 | 6 | 512 |

-continued

| Code | Count | bits | slots |
|---|---|---|---|
| 4 | 7 | 7 | 256 |
| 3 | 5 | 7 | 256 |
| 10 | 3 | 8 | 128 |
| 11 | 1 | 8 | 128 |
| 7 | 0 | 0 | 0 |
| Total | 348 | total | 18176 |

Now unused code slots=32768−used code slots (=14412 in the example). Embodiments want to allocate these unused slots to codes by decreasing the number of bits for the code. To decrease a code length by one bit, embodiments double the number of code slots used. Thus, to be able to decrement the code length, the unused slots must be at least the number of currently used slots for the code.

On the first pass (step 1260), embodiments try to decrement the length of codes that are close to the next bit level in one pass from most frequent code to least frequent since a code with a larger count gives more size reduction from reducing its bit count but uses more of the available code space. The test to decide if the length should be decreased is given by:

```
current_code_slots = code slots currently used by the code
unused_code_slots = code slots unused when embodiments are
processing the given code
code_count = count for this code
rem_count = sum of counts for this code and all less frequent codes
the bit length is decremented if
current_code_slots <= unused_code_slots
// so embodiments can decrement
AND
(code_count/rem_count) >= FACTOR *(current_code_slots/
unused_code_slots)
```

The idea is that, if the ratio code_count/rem_count is large, the gain from reducing the codes bit length is relatively large, while, if the ratio current_code_slots/unused_slots is relatively small, the "cost" of reducing the code's bit length is relatively small. The tradeoff is expressed in the FACTOR, which in the embodiment is ½ and the test is implemented as:

(val1=current_code_slots*rem_count/2)<=
    (val2=code_count*unused_code_slots)

In the example (* indicates bit count decremented):

| code | count | bits | cur slots | rem_cnt | unused | val1 | val2 | new bits | new slots |
|---|---|---|---|---|---|---|---|---|---|
| 0 | 130 | 2 | 8192 | 348 | 14592 | 1425408 | 1896960 | *1 | 16384 |
| 2 | 80 | 3 | 4096 | 218 | 6400 | 446464 | 512000 | *2 | 8192 |
| 1 | 50 | 4 | 2048 | 138 | 2304 | 141312 | 115200 | 4 | 2048 |
| 5 | 27 | 5 | 1024 | 88 | 2304 | 45056 | 62208 | *4 | 2048 |
| 9 | 21 | 5 | 1024 | 61 | 1280 | 31232 | 26880 | 5 | 1024 |
| 8 | 15 | 6 | 512 | 40 | 1280 | 10240 | 19200 | *5 | 1024 |
| 6 | 9 | 6 | 512 | 25 | 768 | 6400 | 6912 | *5 | 1024 |
| 4 | 7 | 7 | 256 | 16 | 256 | 2048 | 1792 | 7 | 256 |
| 3 | 5 | 7 | 256 | 9 | 256 | 1152 | 1280 | *6 | 512 |
| 10 | 3 | 8 | 128 | 4 | 0 | 256 | 0 | 8 | 128 |
| 11 | 1 | 8 | 128 | 1 | 0 | 64 | 0 | 8 | 128 |
| 7 | 0 | 0 | 0 | 0 | 0 | 0 | 0 | | |
| total | 348 | total | 18176 | | | | | | 32768 |

Note that the code length for code 4 with a count of 7 is more than the code length for code 3 with a count of 5. See possible improvements below.

```
First Pass (step 1260)
unused_code_slots = total_slots − used_slots
rem_count = total_count
for index = 0 to nz_count − 1
    code_count = RIGHTSHIFT(sort_array[index], 16)
    bits[index] = bits[index] − bit_adjust
    current_code_slots = RIGHTSHIFT(total_slots, bits[index])
    val1 = (current_code_slots * rem_count)/2
    val2 = code_count * unused_code_slots
    if((current_code_slots <= unused_code_slots) LOGAND
        (val1 <= val2))
        bits[index] = bits[index] − 1
        unused_code_slots = unused_code_slots − current_code_slots
    end if
    rem_count = rem_count − code_count
end for
```

After the first pass, if there are any unused slots, repeated passes are made, from most frequent code to least frequent, decrementing bit lengths if
current_code_slots<=unused code_slots //so embodiments can decrement

```
Remaining Pass (step 1272)
for index = 0 to nz_count - 1
    current_code_slots = RIGHTSHIFT(total_slots, bits[index])
    if(current_code_slots <= unused_code_slots)
        bits[index] = bits[index] - 1
        unused_code_slots = unused_code_slots - current_code_slots
    end if
end for
```

To finish up, embodiments fill in the outbits array with the bit length for each code and blcnts array with the total number of codes of each size and return the total number of bits used.

```
Do Output (step 1274)
total_bits = 0
for index = 0 to nz_count - 1
    count = RIGHTSHIFT(sort_array[index], 16)
    code = sort_array[index] AND 0x1ff
    outbits[code] = bits[index]
    blcnts[bits[index]] = blcnts[bits[index]] + 1
    total_bits = total_bits + bits[index] * count
end for
return total_bits
```

Assigning Huffman Codes Based on Code Sizes and Building the Encode Table

The idea is to assign code slots out of 65536 (16 bits) then bit reverse the code slot value so the most significant bits of the code slot value become the leading bits of the Huffman code. This guarantees a prefix code, according to an embodiment.

Starting with the bit length for each code, and a table of the number of codes of each length and then assign a 16 bit next_code (representing the smallest of the set of code slots) for each size. The code slots (and next_code) are allocated from shortest code to longest. The number of code slots for a bit length of bits is 2^(16-bits). Next_code starts with 0 at bit length 1 and to get to the following next_code, embodiments add num_codes*code_slots[bits].

In the example given in the table below, the left two columns give the code and the bit length of the code (outbits from the previous section). The right columns have a row for each bit length (bits column). The num codes column gives the number of codes on the left with the given bit length (blcnts array form the previous section). The last column gives the (reversed) Huffman code for the next input code of that size. Since code 0 is 1 bit, no other code can start with 0 and all other codes must start with 1. Similarly, code 2 is 2 bits so no other code can start with 1 then 0 so all further codes must start with 11.

| code | Bits | bits | num codes | next_code |
|---|---|---|---|---|
| 0 | 1 | 1 | 1 | 0 |
| 1 | 4 | 2 | 1 | 1000000000000000 |
| 2 | 2 | 3 | 0 | 1100000000000000 |
| 3 | 6 | 4 | 2 | 1100000000000000 |
| 4 | 7 | 5 | 3 | 1110000000000000 |
| 5 | 4 | 6 | 1 | 1111100000000000 |
| 6 | 5 | 7 | 1 | 1111110000000000 |
| 7 | 0 | 8 | 2 | 1111111000000000 |
| 8 | 5 | | | 10000000000000000 |
| 9 | 5 | | | |
| 10 | 8 | | | |
| 11 | 8 | | | |

Input values:
bits[code]=number of bits in Huffman code for code
blcnts[index]=number of codes with bit length of index

```
Setup Code Slots Table:
cur_step = 65536
next_code[0] = 0
next_code[1] = 0
code_step[0] = cur_step
cur_step = cur_step/2
code_step[1] = cur_step
for bits = 1 to 15
    next_code[bits+1] = next_code[bits] + blcnts[bits]*cur_step
    cur_step = cur_step/2
    code_step[bits+1] = cur_step
end for
```

To now assign the codes, embodiments go through the code array, and, in code order, assign next_code[bits] to each code and add 2^(16-bits) to next_code[bits]. The actual code is the bit reversal of the value assigned, taking only the low bits of the reversed value. As described above, each encode table entry has the Huffman code in the low 26 bits and the bit length of the code in the high 6 bits.

```
Build Encode Table
for index = 0 to num_codes - 1
    size = bits[index]
    code = next_code[size]
    next_code[size] = next_code[size] + code_step[size]
    table[index] = BITREVERSE(code) OR LEFTSHIFT(size, 26)
end for
```

The sequence below shows the code assignment for the example:

| code | Bits | assigned code | reversed code |
|---|---|---|---|
| 0 | 1 | 0 | 0 |
| 1 | 4 | 1100000000000000 | 0011 |
| 2 | 2 | 1000000000000000 | 01 |
| 3 | 6 | 1111100000000000 | 011111 |
| 4 | 7 | 1111110000000000 | 0111111 |
| 5 | 4 | 1101000000000000 | 1011 |
| 6 | 5 | 1110000000000000 | 00111 |
| 7 | 0 | no code | |
| 8 | 5 | 1110100000000000 | 10111 |
| 9 | 5 | 1110000000000000 | 01111 |
| 10 | 8 | 1111111000000000 | 01111111 |
| 11 | 8 | 1111111100000000 | 11111111 |

Huffman table information is included at the beginning of the compressed file by giving the sizes of each code, 2 codes per byte (4 bits per code). A value of 0 means the code does not appear in the stream.

Figure 13:
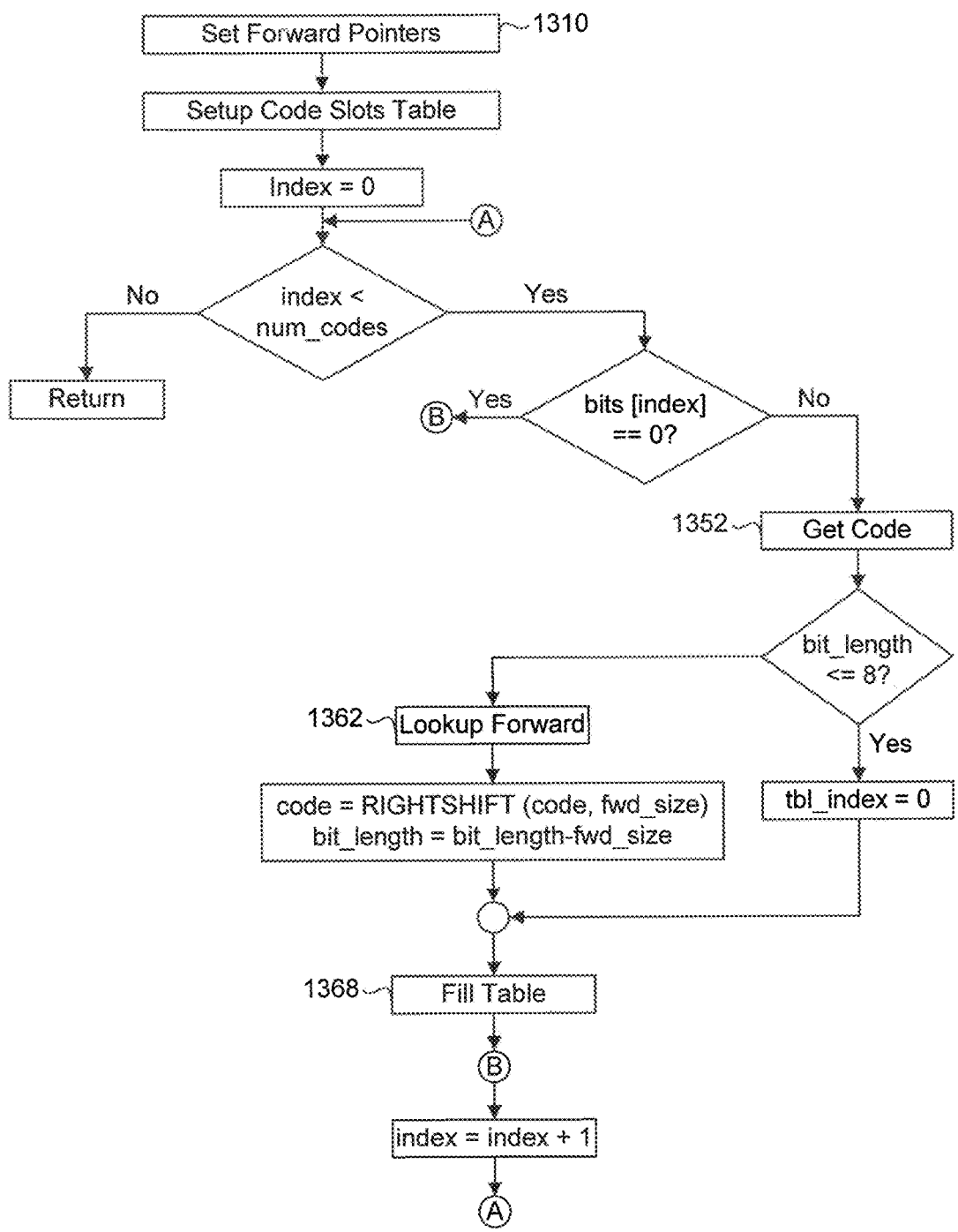
FIG. 13 is an illustration of a detailed flow diagram of building Huffman decode tables according to an embodiment.

Constructing Huffman Decode Tables:

FIG. 13, labeled Build Decode Tables Flow, 1300 presents information about how Huffman decode tables are constructed. The Huffman decode tables are a set of 256 element tables described above in the section on Huffman decoding details. Each table has 256 entries. In use, the next 8 bits of the input stream are used to index the table. In order to find a code, it may have to appear multiple times in the table. For instance, suppose a Huffman code is 5 bits long, say 10111. In order to recognize this as the next 5 bits in the input stream, all 8 bit values which end in 10111 must have the same table entry indicating the size (5) and the output code.

As described above, if the Huffman code is longer than 8 bits, it cannot be found in one table but is split across the base table and a forwarding table. The input to building the tables is the array of bit lengths for each code, bits[ ] and the array blcnts[index] giving the number of codes with each bit length. The first step is to fill in the forwarding pointers (step 1310) for all codes that are more than 8 bits long. Embodiments start with the longest code and work backwards. In order to limit the number of secondary tables, each time embodiments start a new table, embodiments require that the code have 8 bits in the secondary table and the remaining in the forward entry of the base table. Note that embodiments know that leading bits of codes going from longer to shorter start with 0xff.

```
Set Forward Pointers (step 1310):
for index = 0 to 255      // initialize base table with 0
    table[0, index] = 0
end for
entry_count = 2      // number of base table slots for forward entry
for curbit = 15 down to 9 // look for longest code
    if(blcnts[curbit] > 0)
            exit for
    end if
    entry_count = entry_count * 2
end for
nxttbl = 1      // index of next secondary table to use
baseval = 0xff // bit reverse of next forwarding entry to use
// lead bits of longest code
totbits = 0      // code slots in current forward table embodiments have
                 not yet used
while curbit > 8
    bit = curbit − 8      // build forward table entry
    table_entry = 0x8000 OR LEFTSHIFT(bit, 10) OR nxttbl
    nxttbl = nxttbl + 1      // step index for next time
    for val = 1 to count   // fill in count forward table entries
            index = BITREV(baseval)
            table[0, index] = table_entry
            baseval = baseval − 1   // bit rev of next code with same
                                      leading bits
    end for
    // now skip over all the codes that will have the same
    forwarding entry
    totbits += 256      // embodiments have 256 slots in the secondary table
                        // each code with length curbit takes one slot
    while (curbit > 8) LOGAND (totbits >= blcnts[curbit])
            totbits = totbits − blcnts[curbit]      // used that many slots
            curbit = curbit − 1
            totbits = totbits/2      // next block of codes uses twice as
                                       many slots per
    end while
end while
return nxttbl   // number of tables used
```

Once forwarding pointers are set up, embodiments find the Huffman codes for each index (as in building encode tables) and fill in table entries for that code (in the base table for lengths<=8 and in secondary tables for lengths>8.

```
Get Code (step 1352)
    bit_length = bits[index]
    revcode = next_code[size]
    next_code[size] = next_code[size] + code_step[size]
    code = BITREVERSE(revcode)
Fill Table (step 1368)
    entry_count = RIGHTSHIFT(256, bit_length)   //table entries for
    this code
    step = LEFTSHIFT(1, bit_length)      // step between table entries
    table_entry = LEFTSHIFT(bit_length, 10) OR index
    for count = 1 to entry_count
        table[table_index, code] = table_entry
        code = code + step
    end for
Lookup Forward (step 1362)
    fwd_index = code & 0xff   // low 8 bits of code
    val = table[0, fwd_index]   // forward table entry
    fwd_size = ExtractBits(val, 10, 5)  // bits used in forward entry
    table_index = val & 0xff
```

Parallel Processing

The storage compression and decompression (that are part of the operation of embodiments) can take advantage of multiple processing units. The input to be compressed is broken into 1, 2 or 4 equal sized parts. Parts other than the first are passed to worker threads and the first part is compressed by the main thread. Then, the main thread waits for worker threads to finish and assembles the compressed block. This approach applies to both LZDR compression and any subsequent "Huffman" compression. The tests for which "Huffman" approach to use are also parallelized. The size computation for types 2, 3, 5, 6, 7 are done in worker threads and the size computation for type 4 in the main thread.

The compression info includes 2 bits to indicate the number of parts the compressed file was split into and the first few bytes of the compressed block indicate the offset(s) to the start of compressed parts other than the first. Splitting input to be compressed into parts reduces compression by a percent or so, mostly due to the fact that LZDR starts with an empty dictionary at the start of each part and cannot match to strings in previous parts. If there are not as many processors as parts the input is split into, there is a small increase in processing time. Since the number of parts should be set to correspond to the number of processing units on the compressing PC and decompression is almost an order of magnitude faster than compression, this should not impair overall performance.

To parallel process LZDR, each part must use a separate dictionary and count array (the counts are combined before determining dynamic Huffman tables or compression types). It was found that using global arrays for the dictionary and counts was about 10% faster than putting the dictionary and counts into a data structure and referencing off a pointer to the data structure. As a result there are 4 copies of the LZDR compression routine which differ only in which global dictionary and count arrays they reference, according to an embodiment.

Additional Embodiments

The idea is to assign code slots out of 65536 (16 bits) then bit reverse the code slot value so the most significant bits of the code slot value become the leading bits of the Huffman code. This guarantees a prefix code, according to an embodiment.

The Huffman tables may be computed by a sub-optimal method that is suited to a particular chip architecture. Changing to true Huffman tables may improve compression somewhat but may increase processing time. Note that true Huffman codes could require 16 or in very rare cases 17 bit codes: 17 bit codes would mean embodiments would need to forward more than once on decode; and, 16 bit codes would mean embodiments would need some additional information in the compressed block header that gives the code lengths for dynamic Huffman codes. Currently, 4 bits per code are allocated allowing values from 0 (code not used) to 15. One possibility is to have the first nibble indicate whether to add 1 to non-zero values to get bit lengths. If there is no code of length 1, set the flag. Otherwise, the longest code may be forced to have length 15.

One exemplary LZDR dictionary is based on a processor-specific dictionary which had, in each hash bucket, 5 4 byte compare words, 5 2 byte offsets and a 1 byte counter, which used to fit into a single 32 byte data cache line so all hash lookup processing could be done with one memory read. If there are more than 4 hits in one hash entry, the oldest entry is discarded so some matches or better matches may be missed. Alternative different dictionary organizations might be used that might find more matches and thus improve LZDR compression.

LZDR starts with an empty dictionary so, initially, there are no matches (that is the major reason compression improves with larger block sizes). It might be possible to start with the dictionary preloaded with some data in hopes of finding matches. It cannot be worse than an empty dictionary, according to an embodiment. One could even have several pre-load candidates and try all in parallel. How to choose the pre-load is a problem to be addressed. There are also issues since the offset in the dictionary is 16 bits and embodiments are doing 64K blocks so there would be offset overlap that would have to be coded around.

Type 4 compression is the most frequent choice. The other methods are, for the most part, backup methods. Types 3, 5, 6 and 7 use a fixed Huffman table for run length MSBit codes, match length MSBit codes and literal count MSBit codes. In addition, types 5, 6 and 7 use fixed tables for literal bytes. These tables were constructed using statistics from processing a large number of files through LZDR. Different types of files were used for the literal tables for 5, 6 and 7. In fact, most of the blocks in those files would be compressed by type 4. If there were some way to get statistics only from those files where the alternate methods compete with type 4, embodiments might get better compression on those files.

For types 3, 5, 6, 7, as an alternative to using Huffman encoded lengths for runs matches and literal strings, embodiments could use the LZDR block headers. Testing on arbitrary files showed the Huffman coding to be slightly superior but it may be that on files where type 4 does poorly, the LZDR headers may be better.

For short runs or matches encoded with Huffman codes, it may be possible for the literal string encoded by Huffman codes to be shorter than the encoding as a match or run. This situation can happen if the character codes are short and the run, match or offset MSBit codes are relatively long. It may be desirable to check this on the fly and replace long run or match codes with shorter literal string codes.

As noted in the description of the algorithm for assigning Huffman code bit lengths, occasional non-monotonic bit assignments happen. Embodiments may include a processing pass to sort these non-monotonic assignments.

Example Computer System

Figure 14:
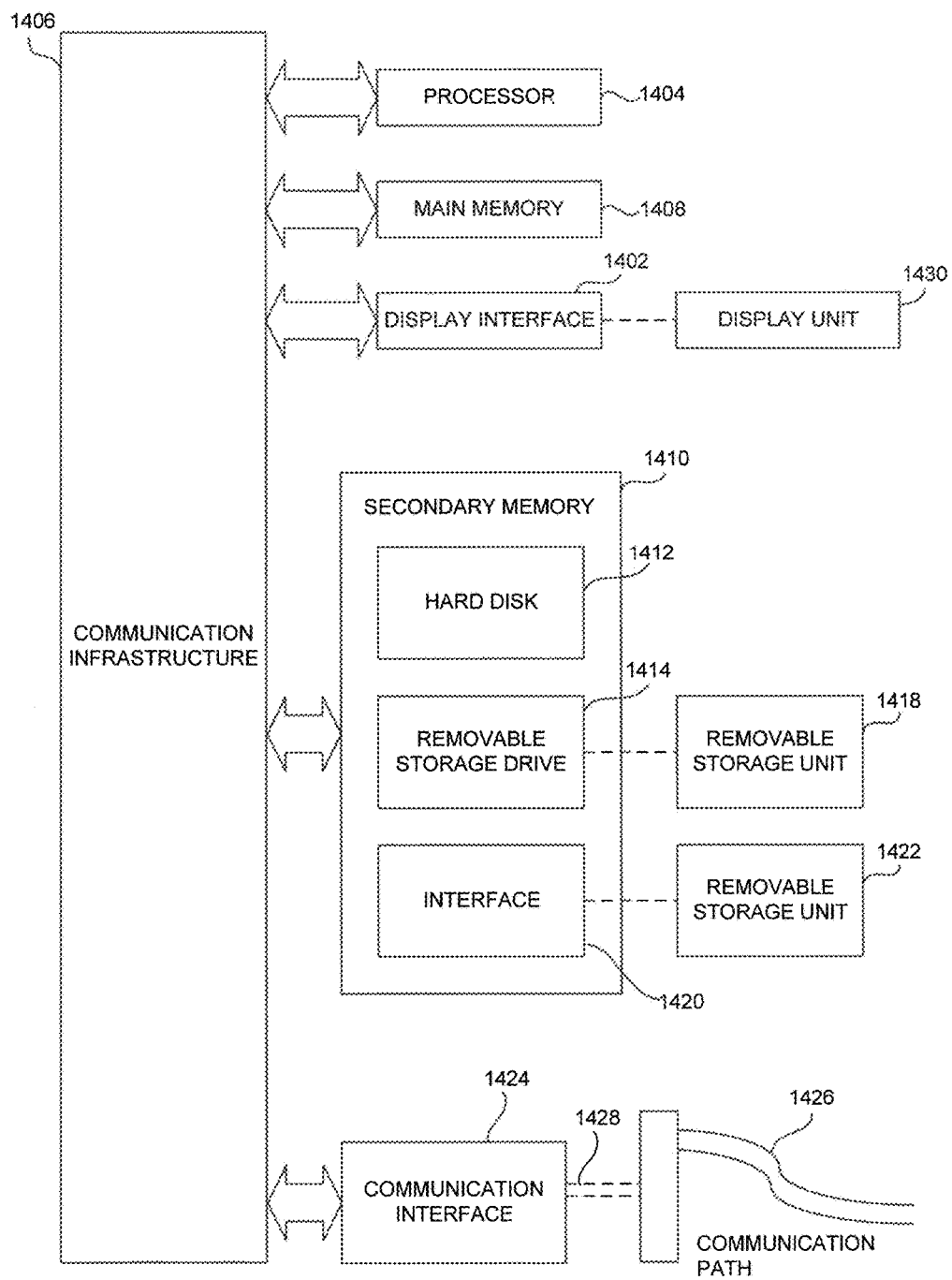
FIG. 14 is an illustration of an example computer system in which embodiments, or portions thereof, can be implemented as computer readable code.

Various aspects of embodiments of the present invention may be implemented in software, firmware, hardware, or a combination thereof. FIG. 14 is an illustration of an example computer system 1400 in which embodiments of the present invention, or portions thereof, can be implemented as computer-readable code. For example, the methods illustrated by flowcharts 100-1300 of FIGS. 1-13, respectively, can be implemented in system 1400. Various embodiments of the present invention are described in terms of this example computer system 1400. After reading this description, it will become apparent to a person skilled in the relevant art how to implement embodiments of the present invention using other computer systems and/or computer architectures.

It should be noted that the simulation, synthesis and/or manufacture of various embodiments of this invention may be accomplished, in part, through the use of computer readable code, including general programming languages (such as C or C++), hardware description languages (HDL) such as, for example, Verilog HDL, VHDL, Altera HDL (AHDL), or other available programming and/or schematic capture tools (such as circuit capture tools). This computer readable code can be disposed in any known computer-usable medium including a semiconductor, magnetic disk, optical disk (such as CD-ROM, DVD-ROM). As such, the code can be transmitted over communication networks including the Internet. It is understood that the functions accomplished and/or structure provided by the systems and techniques described above can be represented in a core that is embodied in program code and can be transformed to hardware as part of the production of integrated circuits.

Computer system 1400 includes one or more processors, such as processor 1404. Processor 1404 may be a special purpose or a general-purpose processor. Processor 1404 is connected to a communication infrastructure 1406 (e.g., a bus or network).

Computer system 1400 also includes a main memory 1408, preferably random access memory (RAM), and may also include a secondary memory 1410. Secondary memory 1410 can include, for example, a hard disk drive 1412, a removable storage drive 1414, and/or a memory stick. Removable storage drive 1414 can include a floppy disk drive, a magnetic tape drive, an optical disk drive, a flash memory, or the like. The removable storage drive 1414 reads from and/or writes to a removable storage unit 1418 in a well-known manner. Removable storage unit 1418 can comprise a floppy disk, magnetic tape, optical disk, etc. which is read by and written to by removable storage drive 1414. As will be appreciated by a person skilled in the relevant art, removable storage unit 1418 includes a computer-usable storage medium having stored therein computer software and/or data.

Computer system 1400 (optionally) includes a display interface 1402 (which can include input and output devices such as keyboards, mice, etc.) that forwards graphics, text, and other data from communication infrastructure 1406 (or from a frame buffer not shown) for display on display unit 1430.

In alternative implementations, secondary memory 1410 can include other similar devices for allowing computer programs or other instructions to be loaded into computer system 1400. Such devices can include, for example, a removable storage unit 1422 and an interface 1420. Examples of such devices can include a program cartridge and cartridge interface (such as those found in video game devices), a removable memory chip (e.g., EPROM or PROM) and associated socket, and other removable storage units 1422 and interfaces 1420 which allow software and data to be transferred from the removable storage unit 1422 to computer system 1400.

Computer system 1400 can also include a communications interface 1424. Communications interface 1424 allows software and data to be transferred between computer system 1400 and external devices. Communications interface 1424 can include a modem, a network interface (such as an Ethernet card), a communications port, a PCMCIA slot and card, or the like. Software and data transferred via communications interface 1424 are in the form of signals which may be electronic, electromagnetic, optical, or other signals capable of being received by communications interface 1424. These signals are provided to communications interface 1424 via a communications path 1426. Communications path 1426 carries signals and can be implemented using wire or cable, fiber optics, a phone line, a cellular phone link, a RF link or other communications channels.

In this document, the terms "computer program medium" and "computer-usable medium" are used to generally refer to tangible media such as removable storage unit 1418, removable storage unit 1422, and a hard disk installed in hard disk drive 1412. Computer program medium and computer-usable medium can also refer to tangible memories, such as main memory 1408 and secondary memory 1410, which can be memory semiconductors (e.g., DRAMs, etc.). These computer program products provide software to computer system 1400.

Computer programs (also called computer control logic) are stored in main memory 1408 and/or secondary memory 1410. Computer programs may also be received via communications interface 1424. Such computer programs, when executed, enable computer system 1400 to implement embodiments of the present invention as discussed herein. In particular, the computer programs, when executed, enable processor 1404 to implement processes of embodiments of the present invention, such as the steps in the methods illustrated by flowcharts 100-1300 of FIGS. 1-13, respectively, can be implemented in system 1400, discussed above. Accordingly, such computer programs represent controllers of the computer system 1400. Where embodiments of the present invention are implemented using software, the software can be stored in a computer program product and loaded into computer system 1400 using removable storage drive 1414, interface 1420, hard drive 1412, or communications interface 1424.

Embodiments are also directed to computer program products including software stored on any computer-usable medium. Such software, when executed in one or more data processing device, causes a data processing device(s) to operate as described herein. Embodiments of the present invention employ any computer-usable or -readable medium, known now or in the future. Examples of computer-usable mediums include, but are not limited to, primary storage devices (e.g., any type of random access memory), secondary storage devices (e.g., hard drives, floppy disks, CD ROMS, ZIP disks, tapes, magnetic storage devices, optical storage devices, MEMS, nanotechnological storage devices, etc.), and communication mediums (e.g., wired and wireless communications networks, local area networks, wide area networks, intranets, etc.).

Conclusion

It is to be appreciated that the Detailed Description section, and not the Summary and Abstract sections, is intended to be used to interpret the claims. The Summary and Abstract sections may set forth one or more but not all example embodiments of the present invention as contemplated by the inventors, and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the relevant art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by a person skilled in the relevant art in light of the teachings and guidance.

The breadth and scope of the present invention should not be limited by any of the above-described example embodiments, but should be defined only in accordance with the following claims and their equivalents.

What is claimed is:

1. A system for content estimation data compression, the system comprising:
    a memory configured to store a data block; and
    one or more processors including a run length encoder and a dictionary compression encoder configured to execute on the one or more processors,
    wherein the one or more processors are configured to:
        determine whether the data block is parsable, and in response to determining that the data block is parsable, compress the data block using content dependent data compression;
        in response to determining that the data block is not parsable, determine whether the data block content is estimable by applying run length encoding and dictionary encoding, performing a compression error check on results of the applying, and compiling one or more compression statistics on the data block, wherein the applying of run length encoding occurs before the applying of dictionary encoding;
        in response to determining that the data block is not parsable and that the data block content is not estimable based on the results of the applying, compress the data block using content independent data compression; and
        in response to determining that the data block is not parsable and that the data block content is estimable based on the results of the applying, estimate the content of the data block, aggregate the data block with a second data block of estimated data content to produce an accumulated data block for generating a higher compression ratio relative to individually compressed blocks, select one or more encoders to be applied to the accumulated data block based on the estimated content of the data block, wherein the one or more selected encoders to be applied to the data block utilize the one or more compression statistics, and compress the accumulated data block with the one or more selected encoders to a smaller size than the first and second data blocks in uncompressed form.

2. The system of claim 1, wherein the one or more applied encoders output encoded data when a compression ratio of compressed data exceeds a compression threshold.

3. The system of claim 1, wherein the one or more applied encoders output unencoded data when a compression ratio of compressed data is less than a compression threshold.

4. The system of claim 1, wherein the applying run length encoding includes utilizing an LZDR compression technique.

5. The system of claim 1, wherein the applying dictionary encoding includes utilizing a Huffman encoding technique.

6. The system of claim 1, wherein the performing the compression error check includes determining whether a failure has occurred in creating a compression table during the application of the dictionary encoding.

7. The system of claim 1, wherein the one or more processors are further configured to compress the accumulated data block in response to determining that a predefined minimum quantity of data has been aggregated.

\* \* \* \* \*

UNITED STATES PATENT AND TRADEMARK OFFICE
CERTIFICATE OF CORRECTION

PATENT NO. : 9,792,308 B2
APPLICATION NO. : 13/875884
DATED : October 17, 2017
INVENTOR(S) : James J. Fallon et al.

Page 1 of 1

It is certified that error appears in the above-identified patent and that said Letters Patent is hereby corrected as shown below:

On the Title Page

In item (63), remove "Continuation-in-part of application No. 14/936,312, filed on Nov. 9, 2015, which is a continuation of application No. 14/727,309, filed on Jun. 1, 2015, which is a continuation of application No. 14/495,574, filed on Sep. 24, 2014, now Pat. No. 9,054,728, which is a continuation of application No. 14/251,453, filed on Apr. 11, 2014, now Pat. No. 8,933,825, which is a continuation of application No. 14/035,561, filed on Sep. 24, 2013, now Pat. No. 8,717,203, which is a continuation of application No. 13/154,211, filed on Jun. 6, 2011, now Pat. No. 8,643,513, which is a continuation of application No. 12/703,042, filed on Feb. 9, 2010, now Pat. No. 8,502,707, which is a continuation of application No. 11/651,366, filed on Jan. 8, 2007, now abandoned, and a continuation of application No. 11/651,365, filed on Jan. 8, 2007, now Pat. No. 7,714,747, which is a continuation of application No. 10/668,768, filed on Sep. 22, 2003, now Pat. No. 7,161,506, which is a continuation of application No. 10/016,355, filed on Oct. 29, 2001, now Pat. No. 6,624,761, which is a continuation-in-part of application No. 09/705,446, filed on Nov. 3, 2000, now Pat. No. 6,309,424, which is a continuation of application No. 09/210,491, filed on Dec. 11, 1998, now Pat. No. 6,195,024."

Signed and Sealed this
Fourth Day of September, 2018

Andrei Iancu
*Director of the United States Patent and Trademark Office*